(12) United States Patent
Gutin

(10) Patent No.: US 6,671,295 B2
(45) Date of Patent: *Dec. 30, 2003

(54) TUNABLE DIODE LASER SYSTEM, APPARATUS AND METHOD

(75) Inventor: Mikhail A. Gutin, Albany, NY (US)

(73) Assignee: InterScience, Inc., Troy, NY (US)

( * ) Notice: Subject to any disclaimer, the term of this patent is extended or adjusted under 35 U.S.C. 154(b) by 95 days.

This patent is subject to a terminal disclaimer.

(21) Appl. No.: 09/939,908

(22) Filed: Aug. 27, 2001

(65) Prior Publication Data

US 2002/0018496 A1 Feb. 14, 2002

Related U.S. Application Data

(63) Continuation-in-part of application No. 09/152,428, filed on Sep. 14, 1998, now Pat. No. 6,282,213.

(51) Int. Cl.$^7$ .............................. H01S 3/10; H01S 3/08
(52) U.S. Cl. ............................ 372/20; 372/98; 372/99
(58) Field of Search .............................. 372/20, 98, 99

(56) References Cited

U.S. PATENT DOCUMENTS

| | | |
|---|---|---|
| 4,216,439 A | 8/1980 | Pond et al. |
| 4,896,325 A | 1/1990 | Coldren |
| 4,897,843 A | 1/1990 | Scott |
| 4,920,541 A | 4/1990 | Baumgartner et al. |
| 5,230,005 A | 7/1993 | Rubino et al. |
| 5,276,695 A | 1/1994 | Scheps |
| 5,319,668 A | 6/1994 | Luecke |
| 5,524,012 A | 6/1996 | Wang et al. |
| 5,624,437 A | 4/1997 | Freeman et al. |
| 5,734,666 A | 3/1998 | Wada et al. |
| 5,771,252 A | 6/1998 | Lang et al. |
| 5,949,801 A | 9/1999 | Tayebati |
| 6,018,536 A | 1/2000 | Alphonse |
| 6,023,480 A | 2/2000 | Dragone |
| 6,049,554 A | 4/2000 | Lang et al. |
| 6,108,355 A | 8/2000 | Zorabedian |
| 6,192,059 B1 | 2/2001 | Karioja et al. |
| 6,205,159 B1 | 3/2001 | Sesko et al. |
| 6,231,195 B1 | 5/2001 | Gutin |
| 6,256,328 B1 * | 7/2001 | Delfyett et al. ............... 372/23 |
| 6,282,213 B1 | 8/2001 | Gutin et al. |
| 6,282,215 B1 | 8/2001 | Zorabedian et al. |
| 6,301,274 B1 | 10/2001 | Tayebati et al. |

OTHER PUBLICATIONS

Zhongqi, et al. Programmable Tuning External Cavity Laser Diode. SPIE vol. 2482, Aug. 1995, pp. 269–274.

(List continued on next page.)

*Primary Examiner*—Paul Ip
*Assistant Examiner*—James Menefee
(74) *Attorney, Agent, or Firm*—Jay R. Yablon; Michelle D. Simkulet

(57) ABSTRACT

A tunable laser system where incoming light is separated into wavelength separated light; the separated light is focused into a plurality of single wavelength focal spots. The laser system includes a locally controllable reflectivity array having a plurality of individually controllable localized reflective elements corresponding to and reflecting one of the plurality of focal spots. A wavelength filter substantially allows wavelengths of the incoming light separated by a specified frequency to emerge as filtered light, while substantially barring other wavelengths. The separated light includes this filtered light. An elongation element for elongates the wavelength separated light into a plurality of elongated single wavelength focal spots. The locally controllable reflectivity array includes a plurality of sets of a plurality of individually controllable localized reflective elements, each set corresponding to and reflecting one of the elongated single wavelength focal spots.

92 Claims, 9 Drawing Sheets

OTHER PUBLICATIONS

Uenishi, et al. Micro electro mechanical systems and their photonic application. SPIE vol. 3098, 1997, pp. 374–381.

Littman & Metcalf. Spectrally narrow pulsed dye laser without beam expander. Applied Optics, Jul. 15, 1978, v. 17, #14 pp. 2224–2227.

McNicholl & Metcalf. Synchronous cavity mode and feedback wavelength scanning in dye lasers w/gratings. Applied Optics Sep. 1, 1985. v. 24, #17, pp. 2757–2761.

Harvey & Myatt. External Cavity diode laser using a grazing incidence diffraction grating. Optics Letters, Jun. 15, 1991, v. 16, #12, pp. 910–912.

Okada, et al. Tuning of a dye laser by a birefringent Fabry–Perot etalon. Applied Optics, Apr. 1975, v. 14, #4, pp. 917–922.

Okada, et al. Tilted birefringent Fabry–perot etalon for tuning dye lasers. Applied Optics, Feb. 1976, v. 15, #2, pp. 472–476.

* cited by examiner

TUNABLE DIODE LASER SYSTEM, APPARATUS AND METHOD

CROSS-REFERENCE TO RELATED APPLICATIONS

This application is a continuation-in-part of application Ser. No. 09/152,428, filed Sep. 14, 1998, now U.S. Pat. No. 6,282,213 issued Aug. 28, 2001.

FIELD OF THE INVENTION

This invention relates to the field of tunable diode lasers, and particularly to external cavity tunable diode lasers with high speed wavelength selection capability.

BACKGROUND OF THE INVENTION

Monochromatic light sources, such as lasers, have broad application in the spectroscopic and telecommunications industry due to their ability to be narrowly tuned to emit a specific wavelength. The applications within these industries are pushing the development of tunable lasers. Current desired characteristics include fast and broadband wavelength tuning, arbitrary wavelength selection, simultaneous selection of multiple wavelengths, no macroscopic mechanical motion, long-term amplitude and spectral stability, low cost, small size and capability for remote programming and control of the output spectrum. Most of these requirements are natural extensions of previous achievements in laser tuning. However, the combined requirements of long term amplitude and optical frequency stability and tunability is a challenging requirement in applications such as telecommunications.

In the telecommunications industry, a set of optical frequencies (wavelengths) has been allocated for optical channels by the ITU committee (an international organization headquartered in Geneva, Switzerland within which governments and the private sector coordinate global telecom networks and services). According to the current standards, the optical channels range from 186 THz (1611.79 nm) to 200.95 THz (1491.88 nm) with fixed channel spacings specified at 100 and 50 GHz covering three bands: C, L, and S. The resulting telecommunications standard, i.e., dense wavelength division multiplexing schema (and similar multiplexing schemas that may be later established as standards and utilized in the future) requires precise and stable laser sources and highly discriminating low loss filters to match to the ITU grid.

One of the popular methods of tuning a laser source is by implementing the Littman-Metcalf external laser cavity configuration. A Littman-Metcalf external cavity configuration is traditionally accomplished with a diffraction grating and a mechanically rotating single mirror used to select the specific wavelength. Using this approach, a high degree of precision in the mirror rotation mechanism is required for wavelength selection, and the tuning process is relatively slow. This original approach, as applied to dye laser technology, is described in detail in the following non-patent prior art: M. G. Littman and H. J. Metcalf, Applied Optics, vol. 17, no. 14, 2224–2227, Jul. 15, 1978, and P. McNicholl and H. J. Metcalf, Applied Optics, vol. 24, no. 17, 2757–2761, Sep. 1, 1985.

An intra-cavity etalon is an additional component that can be used in a laser source for enhanced spectral selectivity of the cavity. An additional Fabry-Perot cavity is provided with partially reflecting mirror surfaces, inserted into the laser resonator, and typically, slightly tilted from the normal to the optical axis of the laser cavity. High precision etalons may be maintained at a constant temperature to ensure dimensional stability. The etalon acts as a wavelength dependent filter restricting the wavelength(s) that can pass through it. As a Fabry-Perot cavity, the etalon imposes a set of longitudinal modes in addition to those of the original cavity. The peaks of transmission correspond to the conditions where constructive interference occurs at both surfaces of the etalon. This happens when the effective thickness of the etalon (i.e., the distance between its partially reflecting surfaces) is an integer multiple of ½ the wavelength of the light inside the etalon. The width of the peaks is a function of reflectivity of the etalon's surfaces; higher reflectivity produces narrower peaks. Fabry-Perot etalons can be designed to produce transmission peaks at specific constant intervals. Outside of the transmission peaks light is mostly reflected from the etalon. If the etalon is slightly tilted in the cavity, this reflection causes loss, thus suppressing any spectral components that are not coincident with the etalon's transmission peaks.

The use of an etalon for fine tuning of both dye and diode lasers is well known in the art. Use of Fabry-Perot etalons to tune dye lasers is documented in non-patent prior art such as Okada, et al. Applied Optics, vol. 15, 472, 1976; and Okada, et al. Applied Optics, vol. 14, 917, 1975. The effect of an etalon on spectral output of a dye laser is represented in FIG. 1 in which the transmission peaks of the etalon 982 overlay the dye laser spectral gain curve 980. A Fabry-Perot etalon would effectively narrow the laser output to the transmission peak of the etalon within the spectral gain curve of the dye laser.

Use of a Fabry-Perot etalon to increase the stability of a diode laser is documented for example in Applied Optics, vol. 28, 4251, 1989. The effect of an etalon on spectral output of a diode laser is represented in FIG. 2 in which the transmission peaks of the etalon 982 overlay the diode laser spectral gain curve 984. A Fabry-Perot etalon would effectively narrow the laser output to the transmission peaks of the etalon within the spectral gain curve of the diode laser.

The same effect can be implemented continuously over the spectrum and not limited to the etalon transmission peaks by replacing the etalon in the cavity with a Fabry-Perot interferometer (FPI). The FPI acts as an etalon with tunable (or variable) optical length.

However, in either of the situations illustrated by FIGS. 1 and 2, undesired multi-mode emission—defined by the multiple peaks within the gain curve—may occur, unless some means for additional wavelength selectivity is introduced as part of the laser cavity. Certain particular types of such selectivity, i.e., digital switching means, in combination with the tilted Fabry-Perot etalon, as disclosed in detail herein, do provide relatively coarse wavelength selection to ensure stable single-mode operation of the laser.

As diode lasers have come to replace dye lasers in many applications, a variety of techniques have been applied to tuning diode lasers for implementation in both spectroscopic and telecommunications applications. For example, a variety of U.S. Patents exist for laser tuning with alternative configurations of the mirror at the cavity end. U.S. Pat. No. 4,896,325 discloses an alternative cavity configuration in which a pair of mirrors with narrow discontinuities to provide reflective maxima bound the active cavity. These narrow bands of reflective maxima provide a means for wavelength tuning which is actively controlled by a vernier circuit. U.S. Pat. No. 4,920,541 discloses an external laser cavity configuration of multiple resonator mirrors used to produce multiple wavelength emission from a single laser cavity simultaneously or with a very fast switching time. U.S. Pat. No. 5,319,668 discloses a tunable diode laser with a diffraction grating for wavelength separation and a moveable mirror at the cavity end for wavelength selection. The pivot points are designed to provide an internal cavity length equal to an integer number of half wavelengths at three different wavelengths and an exceptionally close match at all other wavelengths within the tuning range. Alternative tuning arrangements are possible. U.S. Pat. No. 5,771,252 discloses an external cavity continuously tunable wavelength source utilizing a cavity end reflector moveable about a pivot point for simultaneous rotation and translation for wavelength selection.

In addition, several U.S. Patents disclose the use of alternative components in the laser cavity configuration in order to achieve wavelength tuning. U.S. Pat. No. 4,216,439 discloses a spectral line selection technique that utilizes a spectral line selection medium in the gain region of an unstable laser cavity. U.S. Pat. No. 4,897,843 discloses a microprocessor-controlled laser system capable of broadband tuning capabilities by using multiple tuning elements each with progressively finer linewidth control. U.S. Pat. No. 5,276,695 discloses a tunable laser capable of multiple wavelength emission simultaneously or with a very fast switching time between lines by using a laser crystal in the cavity and fine rotation of the cavity end reflective element. U.S. Pat. No. 5,734,666 discloses a wavelength selection apparatus for a laser diode eliminating mechanical motion of a grating by utilizing a laser resonator with piezoelectric-controlled acoustic waves in a crystal for wavelength selection.

U.S. Pat. No. 5,230,005 by Rubino discloses a means of electronically tuning a broadband laser by using a finitely separated spatial light modulator (SLM) and mirror combination in the laser cavity for wavelength selection. The Rubino invention also requires the use of a Fizeau wavemeter as a feedback control element of the system to tune the output wavelength. Rubino's invention compromises broadband wavelength selection and stability primarily though not exclusively caused by the finite distance between the SLM (wavelength selector) and the mirror (wavelength reflector). This finite distance introduces defocusing of the selected beam and vignetting effects to the system. These problems are somewhat corrected by the use of the interferometric feedback control system, but this is not the ideal solution. The feedback control adds cost and complexity, and increases the wavelength selection time. Ideally, a substantially-better solution lies in using means to provide coplanar wavelength selection and reflection that eliminate the defocusing and vignetting problems and does not require the use of interferometric feedback control.

Coplanarity of the selection and reflection elements is important because, after reflection, the light is sent back precisely along its direction of incidence with extreme precision and remains well collimated. This coplanarity feature is not found in the prior art for laser tuning, and was only first disclosed by commonly-owned and invented U.S. Pat. No. 6,282,213. A well-collimated beam before and after reflection eliminates defocusing and vignetting problems experienced by the prior art. Non-coplanarity—the use a mask separated from a mirror by a non-negligible distance in relation to the wavelengths of the light being selected and reflected—results in a blurred focal spot on the mirror surface. The size of the blur, on the one hand, is a function of the distance between the mask and the mirror. On the other hand, because each spot on the mirror surface corresponds to a certain wavelength, it can be translated into ambiguity Δν of the optical frequency ν. By evaluating the optical frequency as a function of the distance between the mask and mirror, the following relationship is established:

$$\Delta \nu = \frac{c}{\lambda^2} \cdot d \cos \beta \cdot \frac{Dh}{f^2} \tag{1}$$

where:
ν=optical frequency
c=speed of light
λ=wavelength
d=grating pitch
β=diffraction angle
D=focusing means diameter
h=mask/mirror distance
f=focusing means focal length A brief example will demonstrate the effect of this distance on a typical system. For example, in the λ=1500 nm wavelength range, using d=1 μm grating pitch, focal length of the lens ~20 mm, and the lens F/#3, a simple calculation results in the optical frequency ambiguity Δν of approximately 100 GHz for h=50 um non-coplanarity. This 100 GHz ambiguity, induced by a separation of only 50 microns, is not acceptable in multiple applications including WDM and DWDM since typical channel spacing is on the same order, i.e. 50 GHz or 100 GHz. Acceptable tolerances would have to be significantly less than the channel spacing in order to differentiate adjacent channels, and in particular, no more than about 10% to 15% of the channel spacing.

Recent non-patent prior art also discloses relevant technology. In SPIE vol. 2482, pp. 269–274 by Zhongqi, Zhang, et al., a microprocessor-controlled tunable diode laser that utilizes a stepper motor to rotate the grating for wavelength tuning is described. In addition, in SPIE vol. 3098, pp. 374–381 by Uenishi, Akimoto, and Nagoka, a tunable laser diode with an external silicon mirror has been fabricated with MEMS technology and has wavelength tunability.

All of the prior art described above is limited in its performance by one or more of the following: requiring mechanical motion, small wavelength range tunability, or limited wavelength-selection order. Especially for applications in spectroscopy and telecommunications, it is very desirable, with limited or no mechanical motion, to achieve broadband wavelength tuning, arbitrary or simultaneous wavelength selection, and long-term amplitude stability. Specifically in telecommunications, the ability to precisely match the ITU grid with long-term amplitude and frequency stability is very much desired, to exceed the capabilities of the above configurations.

OBJECTS OF THE INVENTION

Therefore, it would be desirable to provide a tunable diode laser with coplanar wavelength selection and reflection, which in combination with other optical elements in the laser cavity provides a "perfect" retroreflector within the tolerances discussed above.

It is also desirable to provide a tunable diode laser with broadband digital wavelength selection capability.

It is also desirable to provide a tunable diode laser with the capability of fast, broadband, digital wavelength selection in arbitrary order.

It is also desirable to provide a tunable diode laser with the capability of fast, broadband, digital wavelength selection in arbitrary order that allows discrete switching between a predetermined series of wavelengths.

It is also desirable to provide a tunable diode laser with simultaneous, digital wavelength selection capability.

It is also desirable to provide a tunable diode laser with the capability of fast switching from the current wavelength to any other wavelength in tuning range.

It is also desirable to provide a tunable diode laser with improved internal focusing which will ultimately improve the total output power.

It is also desirable to provide a tunable diode laser with continuous wave (CW) operation capabilities with fast, broadband, digital line selection capability in arbitrary order that allows discrete switching between or among a predetermined series of wavelengths.

It is also desirable to provide a tunable diode laser with CW operation capabilities with simultaneous, digital line selection capability.

It is also desirable to provide a tunable diode laser with fast, digital line selection capability in arbitrary order that allows discrete switching between wavelengths on the 100 GHz ITU grid, or for other predetermined sets of optical frequencies that may be later established as telecommunications standards and utilized in the future.

It is also desirable to provide a tunable diode laser with fast, digital line selection capability in arbitrary order that allows discrete switching between wavelengths on the 50 GHz ITU grid, as well as other standard grids with smaller channel spacing, or for other predetermined sets of optical frequencies that may be later established as telecommunications standards and utilized in the future.

SUMMARY OF THE INVENTION

Disclosed herein is a tunable diode laser configuration that is significantly improved over the prior art. In general, a focusing element, used in combination with a micromirror array (MMA) serves as a "perfect" retroreflector in a laser cavity within certain tolerances as discussed herein. This configuration provides both arbitrary and simultaneous line selection capability over a very broad wavelength range. The use of individually controllable micromirrors of the micromirror array improves the overall durability and ruggedness of the device, and the coplanar wavelength selection and reflection inherent in an MMA enables this "perfect" retroreflection. It also reduces the size, weight, and cost of the laser, compared to lasers with conventional, Littman-Metcalf cavities and mechanical control of the wavelength. Yet another advantage employing an MMA is the absence of hysteresis and age related deterioration of performance due to wearing out of parts in mechanical systems.

A frequency matching embodiment is realized by combining a laser diode/Fabry-Perot etalon combination with an MMA as herein disclosed, it is further possibly to achieve precise selectivity specifically matched to the ITU grid and similar standard grids. These disclosures can, however, be universally adapted to any laser diode device for any application. The advantages that the present invention provides over the prior art are particularly significant in various spectroscopic and telecommunications applications.

A CW embodiment of the system is realized by fully utilizing most or all of the micromirrors found in a typical 2-dimensional MMA by focusing the elliptical output of the laser diode for a given wavelength on a single column of micromirrors instead of on a single micromirror alone. By using a whole column for a selected wavelength, CW operation can be maintained while individual micromirrors are allowed to periodically cycle to their off state without significant output power reduction to overcome stiction.

All embodiments comprise wavelength separation means for separating incoming light into wavelength-separated light; optical focusing means for focusing the wavelength-separated light into a plurality of single-wavelength focal spots; and locally-controllable reflectivity array means comprising a plurality of individually-controllable localized reflective elements each corresponding to and reflecting one of the plurality of single-wavelength focal spots.

The frequency matching embodiment further comprises wavelength filtering means for substantially allowing wavelengths the incoming light which are separated from one another by a specified optical frequency difference to emerge as filtered light, while substantially barring all other wavelengths. The light separated the wavelength separation means comprises this filtered light.

The CW embodiment further comprises focal spot elongation means for elongating the wavelength-separated light into a plurality of elongated, single-wavelength focal spots; and the locally-controllable reflectivity array means comprises a plurality of sets of a plurality of individually-controllable localized reflective elements; each set corresponding to and reflecting one of the elongated, single-wavelength focal spots.

BRIEF DESCRIPTION OF THE DRAWINGS

The features of the invention believed to be novel are set forth in the associated claims. The invention, however, together with further objects and advantages thereof, may best be understood by reference to the following description taken in conjunction with the accompanying drawings in which:

DETAILED DESCRIPTION

Figure 3:
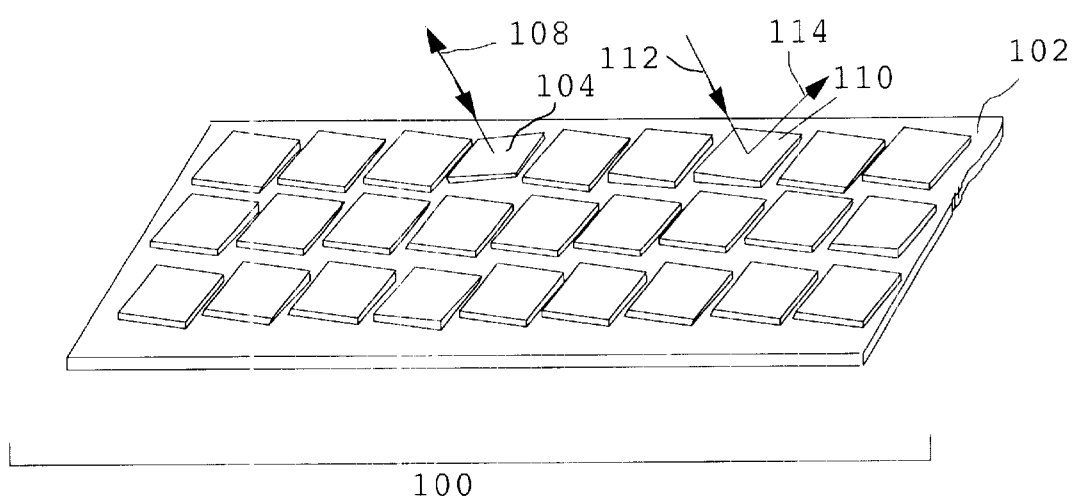
FIG. 3 is an isometric cutaway view of a digital micromirror array showing its individual micromirror elements' interaction with incident light in both resting and +/−θ states.

A primary component of the several illustrative invention embodiments disclosed herein is a digitally controllable micromirror array (MMA). Micromirror arrays are typically configured as linear arrays or two-dimensional arrays. FIG. 3 shows a representative sample of a two-dimensional MMA 100 with each micromirror having 1 degree of freedom (tilt). As shown, MMA 100 comprises a base 102, which supports an array of individually controlled micromirror elements. "On" state micromirrors 104 reflect normally incident light ray 108 back along the direction of incidence, while "off" state micromirrors 110 deflect incident light ray 112 away from the direction of incidence as represented by deflected light ray 114.

The MMA is well established in the prior art as a packaged array of individually controlled micromirrors. The array of micromirrors is formed over an array of individually addressable electrodes. There are various designs for the micromirror support mechanisms that provide various tilt or other changes in spatial orientation, any of which is suitable for use in accordance with the invention. Only one such design will be described here, as a non-limiting illustration of the desired micromirror array functionality. It is to be understood that there are numerous possible micromirror array designs that would be suitable for use in combination with the invention herein disclosed, many of which are known in the art, and others of which may be fabricated in the future and become known in the art. Such arrays are merely employed as elements in applicant's invention embodiments, and it is understood that a variety of equivalent MMA or MMA-type devices can easily be substituted for the MMA described here within the scope of the disclosure and its associated claims, as will be recognized by someone of ordinary skill in these art areas. Applicant's invention does not relate to the MMA itself, but to how the MMA is used in combination with the remaining elements of applicant's system, apparatus and method. The function of the MMA in the present invention is to selectively reflect desired wavelength of light back into the laser cavity while deflecting all other wavelengths away from the optical axis of the cavity.

As regards the MMA that will be used as an illustrative example for this discussion, the micromirror is supported by at least one hinge device and is controlled by at least one address electrode. There is a definable gap between the address electrode and the micromirror to allow for tilting or deformation of the micromirror. A common configuration is a square micromirror supported by two hinges at two corners of the micromirror diagonally opposite each other, and controlled by address electrodes at the two remaining corners. Such a dual control system enables bi-directional tilt or deformation of the micromirror element. Other designs could have the hinges along any edge or across the midplane of each micromirror element and be equally suitable for use in connection with the invention embodiments disclosed and claimed herein.

The individually-addressable micromirrors typically have an "on" state and an "off" state. Although the definition of these states vary by manufacturer, they are one of the following states relative to base 102: flat (i.e. 0 degree tilt), −θ tilt, or +θ tilt. Current micromirror manufacturing technologies set the value of θ in a range around 10 degrees, but it is to be understood that the θ values with which a given MMA is manufactured do not limit applicant's invention, i.e., that applicant's invention can utilize MMAs with θ values other than about 10 degrees. Thus, θ is used to represent the tilt angle of the micromirror in this disclosure since this invention is in no way limited by the value of θ and would thereby be adaptable to any changes or improvements in the micromirror array technology that would alter the tilt angle to other than 10 degrees. Nor is it necessary that the two tilt angles (−θ or +θ) be equal in magnitude with one another. Furthermore, the tilt can be along an axis in the plane of each micromirror, such as hinged along the diagonal, along one edge or across the middle.

Figure 4:
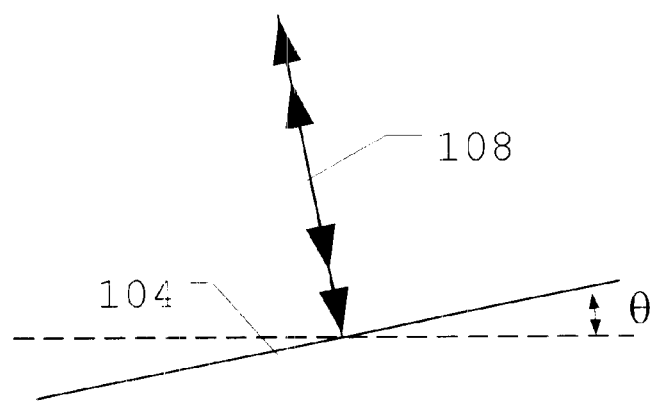
FIG. 4 is a schematic line drawing detailing the propagation of incident light on an individual micromirror array element in its "on" +θ state.
Figure 5:
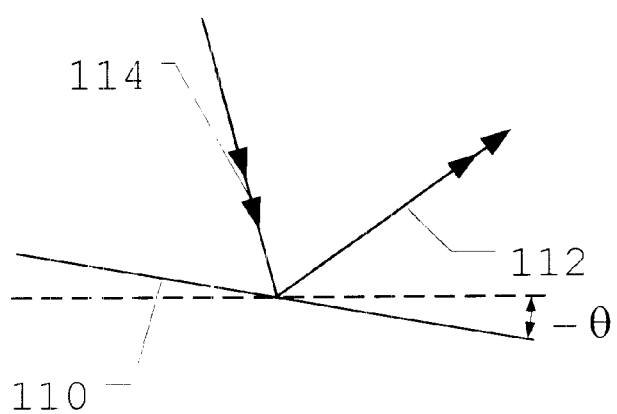
FIG. 5 is a schematic line drawing detailing the propagation of incident light on an individual micromirror array element in its "off" −θ state.

FIG. 4 shows a representative incident light ray 108 normally reflected from the micromirror 104 in the "on" +θ state. FIG. 5 shows a representative incident light ray 114 deflected away from its incident path when the micromirror 110 is in the "off" +θ state, as shown by deflected light ray 112. For ease of interpretation, this disclosure will follow a convention wherein the "off" state of the micromirror 216 comprises a −θ tilt, and the "on" state comprises a +θ tilt, as shown in FIGS. 4 and 5, respectively.

It is important to understand—irrespective of what technological developments may take place in the future—that current MMA technology is limited by the inherent need to periodically cycle individual micromirrors to the opposite state (i.e., back and forth between +θ and −θ) in order to prevent the negative effects of memory and fatigue on the individual micromirror element hinges. Without this periodic cycling, memory and fatigue on the hinges would ultimately prevent the micromirror element from switching to the alternative state, causing the micromirror element to permanently remain in the given state. The MMA would thus wear out and need to be replaced which is expensive and disruptive, and whatever application the MMA is being employed for would be undermined by improperly-functioning micromirrors.

Figure 7:
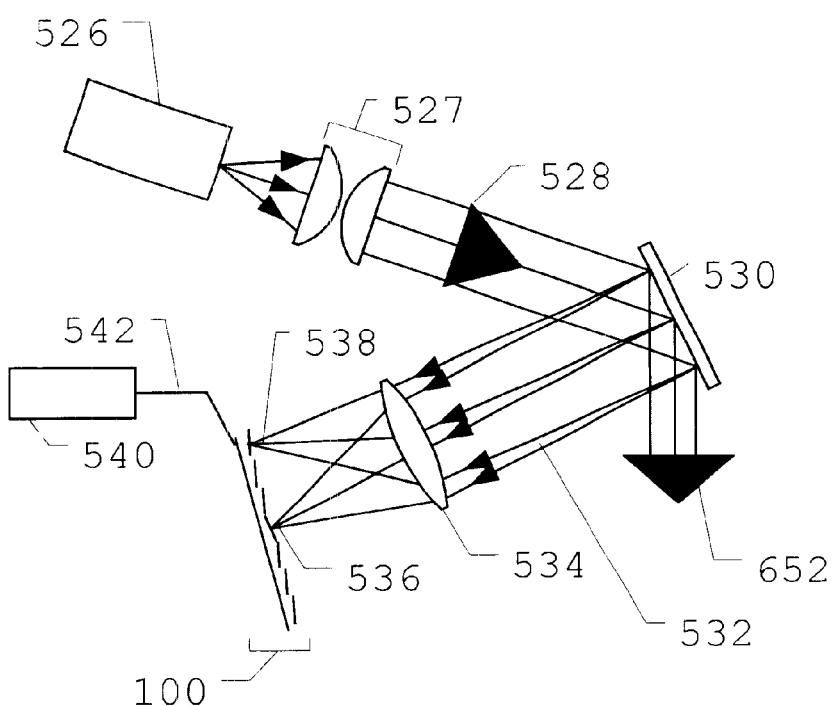
FIG. 7 is a schematic view of the entire tunable diode laser system showing the incident light path.
Figure 8:
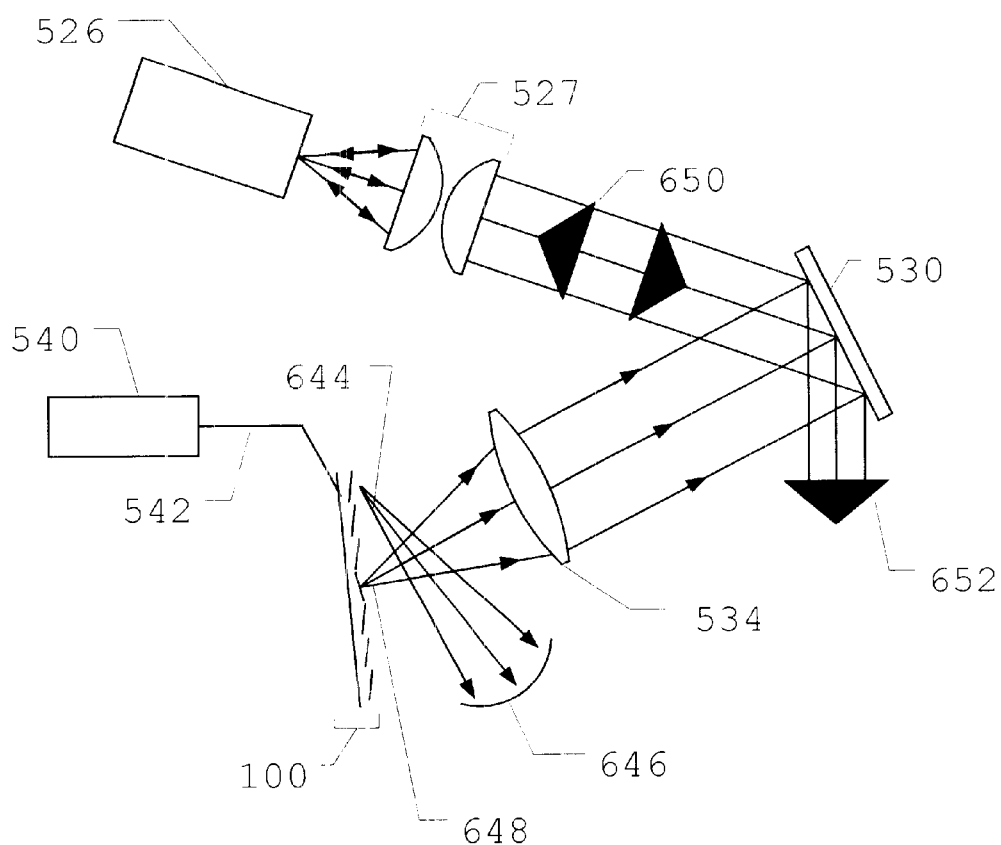
FIG. 8 is a schematic view of the entire tunable diode laser system showing the reflective light path.

A first preferred embodiment of the invention is detailed in FIGS. 7 and 8. FIG. 7 details the incident path to MMA 100 while FIG. 8 details the reflective path from MMA 100, in relation to active media 526 such as but not limited to a laser diode, and other optical elements to be discussed. Note that active media 526 is the device which is the origin of seed light as well as an amplifier of seed light and light reflected within the overall system. This seed light, after amplification, selection and feedback using the devices and methods disclosed herein, becomes the laser light output 652.

Referring now to FIG. 7, active media 526 produces spontaneous emission over a set of output light waves 528, over a broad spectrum of wavelengths that is collimated by collimating means 527 such as but not limited to the illustrated lens set. A reflection-type diffraction grating 530 is positioned in front of the light wave output of active media 526 and collimating means 527 so as to diffract output light waves 528. The angle of diffraction is dependent, of course, on wavelength of light. The majority of the light is diffracted into the first order, or alternatively a higher order, and diffracted light waves 532 are passed through a focusing element(optical focusing means) 534, such as, for example, a lens or a mirror, for transforming the diffraction angle of diffracted light waves 532 to spatially disperse along a geometric line according to wavelength. Some of the light is also emitted from the cavity along the zeroth order as output light 652.

As such, a set of focused light waves of a first wavelength 536 and a set of focused light waves of a second wavelength 538, and so on, are individually brought to points of focus as a plurality of single-wavelength focal spots in the same focal plane, and displaced from one another along a geometric line. All wavelengths present in the output light waves 528 of the active media 526 are separated in this manner. Although the total number of wavelengths present can be numerous, only two are shown in the figure for ease of illustration and discussion.

Figure 6:
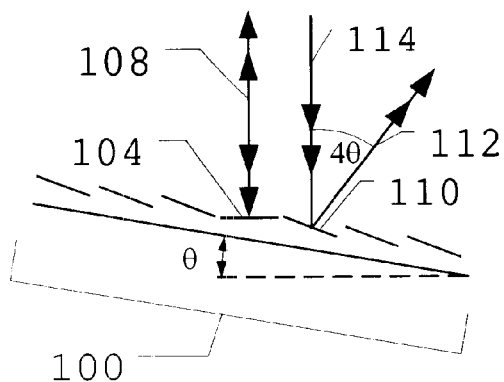
FIG. 6 is a schematic line drawing detailing the relative positioning of the MMA in the tunable diode laser system.

The micromirror array 100 is then located in the same plane as the focal plane of focusing element 534, i.e., in the same plane in which the light waves of first and second wavelengths, 536 and 538 respectively, and other wavelengths, are focused. In preferred embodiments of the invention, as shown in FIG. 6, the entire MMA 100 is placed at an angle θ relative to the incident (wavelength-separated) light 108, 114 as shown in FIG. 6, such that the "on" state micromirrors 104 are normal to the incident light 108 and the incident light will thus be "perfectly" retroreflected straight back towards its origin. Because of this angular placement, the "off" state micromirrors 110 deflect incident light 114 at an angle given by 4θ, as shown by deflected light 112 in FIG. 8. Again, while a particular MMA embodiment is used herein for discussion, the key point is that it is preferred to orient the MMA such that micromirrors in the "on" state are substantially normal relative to incident path of the wavelength-separated light spots and will thus retroreflect that light "perfectly," regardless of the chosen MMA.

Figure 11:
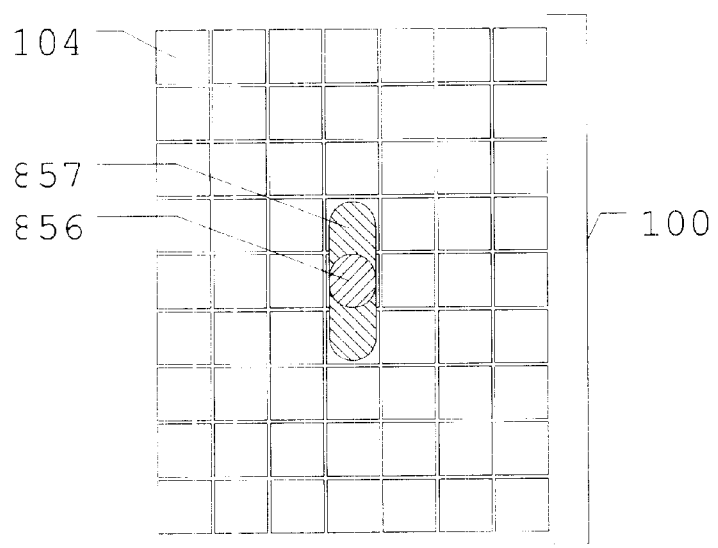
FIG. 11 is a top view of the MMA showing the astigmatic and corrected focal spot created by the optical layout of the laser cavity.

Each of the separated wavelengths, such as focused light waves of first wavelength and second wavelength, 536 and 538 respectively, is focused on, and its reflection thus controlled by, a single micromirror array element in the embodiments of FIGS. 7 and 8 (see, e.g., FIG. 13, to be discussed further below), or a regional group of micromirror array elements in the embodiments of FIGS. 14 and 15 (see, e.g., FIGS. 11 and 12, to be discussed further below).

As stated, each wavelength is associated with an individual element or regional group of elements of the MMA 100. For FIGS. 7 and 8, an individual element is assumed. Control module 540 sends a control signal 542 to the MMA 100 setting the configuration of its individual elements to control the selection of the light spots such as at 536 and 538. When it is desired to select one or more of the wavelengths of these light spots for lasing, the MMA element upon which these selected wavelengths are focused is moved into the "on" (+θ) state shown in FIG. 4. The MMA element for separated wavelengths which are not to be used for lasing, i.e., the MMA elements for the deselected wavelengths, on the other hand, are moved into the "off" (−θ) state, as shown in FIG. 5.

Now referring to FIG. 8, the deselected light 644 reflected from such a "off" state (−θ) micromirror element 110 is deflected away from focusing element 534 and collected by a light trap 646. The laser cavity thus has high losses for this wavelength, no feedback is provided, and no lasing occurs as a result. (Only one such deflecting −θ micromirror element 110 is illustrated here for simplicity. It is understood that in practice a plurality of such deflections can and do occur.)

The wavelength selection is carried out by setting the individual micromirrors 104 associated with desired, selected wavelengths into their "on" (+θ) states. The "on" state micromirrors 104 therefore act as the reflective elements of the laser cavity. The cavity thus has high feedback for the selected wavelengths 648 that are reflected by the micromirrors. As a result of this feedback, emission of the laser diode is amplified over multiple passes through the cavity, resulting in laser action in which the selected wavelengths are ultimately emitted as output light 652 along the zeroth order of the diffraction grating 530. Specifically referring to FIG. 8, a +θ micromirror array element 104 in the "on" state will reflect the selected wavelength 648 back through focusing element 534 to the diffraction grating 530. This provides selected wavelength light feedback 650 back to the active media 526 to promote amplification and thus lasing at the particular selected wavelength or wavelengths.

Preferably, though there are alternatives, the first diffraction order, or alternatively a higher diffraction order, of the grating 530 is used to provide the light feedback 650, while the laser output light signal 652 is produced along the zero order of the diffraction grating 530. This output method is shown only as an example. Other output methods apparent to someone of ordinary skill can be used, such as but not limited to outputting through the rear facet of active media 526.

As stated above, specific wavelengths within the gain spectral range of active media 526 can be selected for feedback, amplification and laser output by deflecting their associated micromirror array element(s) 104 into the "on" state. Similarly, specific wavelengths within the gain spectral range of active media 526 can be deselected for amplification by deflecting their associated micromirror array element 110 to their "off" state, providing no feedback. This is the most basic system configuration in which the present invention is implemented. The control module 540 serves as the user interface. Wavelength selection by the user is converted by the control module 540 to a specific MMA 100 configuration of deflection into the "on" and "off" states, and a control signal 542 sent to the MMA 100 for implementation of this configuration.

Figure 9:
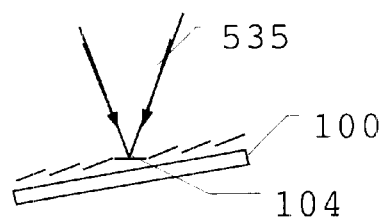
FIG. 9 is a schematic view used to discuss the importance of coplanarity to avoid undesired defocusing and vignetting effects.

A micromirror array 100 which is used as disclosed above, when combined with focusing element 534 (e.g. lens or mirror), comprises a "perfect" retroreflector, defined as a reflector in which every incident beam (defined as a set of rays of the same direction) is reflected exactly parallel to its direction of incidence. This is achieved due to the co-planar nature of selection and reflection means of MMA 100 and is an important consideration in the implementation of the present invention. For such a micromirror array 100, the reflective element and the selective element comprise one and the same element and are therefore spatially coplanar, as shown in FIG. 9. As noted earlier, this coplanarity feature is not found in prior art for laser tuning, and was only first disclosed by commonly-owned and invented U.S. Pat. No. 6,282,213.

Coplanarity of selection and reflection is important for laser tuning, because any beam focused by focusing element 534 on an "on" state micromirror element 104 of the micromirror array 100, after reflection and passing again through the focusing element 534, is sent back precisely along its direction of incidence and provides the well collimated output 535. Coplanarity makes a coplanar retroreflector superior in precision and optical properties to devices where a mirror and a spatial filter (mask) are separated by a finite distance, such as in U.S. Pat. No. 5,230,005 to Rubino. The MMA 100 has only a single surface, comprising an array of coplanar selection and reflection elements, onto which the different wavelengths spatially separated by the diffraction grating 530 are focused by the focusing element 534, approximately one wavelength per element. Thus, by employing an MMA, or any other similar technology device ("locally-controllable reflectivity array means") that might be or become available in which selection is carried out coplanar with reflection within the 10% to 15% tolerances earlier discussed, wavelength tuning is accomplished by a "perfect" retroreflector.

The basic configuration of FIGS. 7 and 8 naturally allows for amplification of multiple wavelengths at the same time by simultaneously deflecting all micromirror array elements 104 representing wavelengths selected for amplification to the "on" state, and all others representing deselected wavelengths to the "off" state.

Moreover, the configuration of FIGS. 7 and 8 can also be used for fast digital wavelength selection. This is achieved through the control module 540 by programming a series of control signals 542 to be sent to the MMA 100 to control and activate (by switching to "on" state) selected micromirrors 104 and thus their corresponding wavelengths, in a specific chosen sequence. This allows for switching between a selected wavelength or set of wavelengths and the next selected wavelength or set of wavelengths within the switching time of the micromirror array elements, typically on the order of 20 μsec or less.

The key point is that MMA 100, or whatever other device is used as a substitute (equivalent) for MMA 100, must provide the digital, functional ability to selectively reflect back in a given direction, or not reflect back in that given direction, light which impinges upon each localized region of that device. Generically, the MMA 100, and any other suitable device which provides this fundamental functionality, shall be referred to as a "locally-controllable reflectivity array means." The local, selectable reflective elements of such an array (such as the individual micromirrors of MMA 100) will be generically referred to as "localized reflective elements" of that array.

Figure 10:
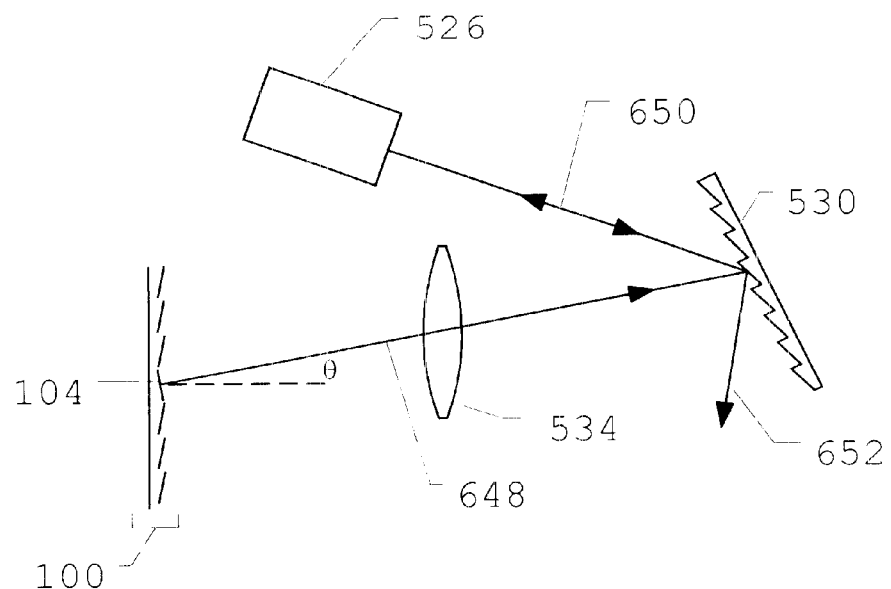
FIG. 10 is a zoomed in schematic view of the light path between the laser diode and the MMA illustrating the layout of the various key system elements in relation to the optical axis.

It is very important to understand that the optical layout of system components illustrated in FIGS. 7 and 8 can introduce ellipticity and astigmatism into the separated wavelengths 536, 538 unless otherwise compensated for in the optical characteristics and in the positioning of the focusing element 534. Edge-emitting laser diodes typically have astigmatism on the order of a few tens of microns and an ellipticity ratio of 4:1. In addition, in the optical layout of FIG. 6 wherein micromirror array 100 is in a tilted position relative to the incident light 108, 114, as shown further by FIG. 10, optimal focusing takes place when focusing element 534 is also preferably tilted with regards to the direction of light propagation 648 in order to optimize the orientation of the focal plane with regards to the MMA 100. In particular, the plane of focusing element 534 is oriented to be substantially parallel to MMA 100 and thus is angled at 90−θ degrees relative to the light propagation 648. As a result, most of the micromirrors 104, 110 of the MMA 100 are positioned off-axis, as are the grating 530 and the active media 526. This may necessitate additional optical design effort to compensate for all of these off-axis configurations and the ellipticity and astigmatism they introduce.

Standard means of correcting ellipticity and astigmatism in diode lasers, described in the literature and commonly used in the art, comprise optical devices based on cylindrical lenses and/or prisms. The function of such devices is to compensate for the natural astigmatism and ellipticity of a laser diode and form a collimated beam with circular cross-section. The same means can be used to provide a desired, elongated, non-circular ellipticity of the beam, rather than circular cross-section, if desired. As will be seen below, this is in fact desired for certain situations.

For efficient operation of the various embodiments disclosed herein, the focal spot on each micromirror of the MMA needs to be sufficiently smaller than the size of the micromirror. If this condition is not satisfied, the wavelength selectivity and output power of the laser will be compromised. The focusing requirement for all wavelengths in the tuning range is more difficult to meet when the tuning range is wide, because of such effects as dispersion in different optical components of the laser.

Typical optical design solutions would use multi-element lenses to achieve these goals. However, these typical solutions introduce multiple surfaces that need anti-reflection coatings, which increases complexity and cost of the device, while still increasing loss from the residual reflection and scattering on each surface. Thus, it is preferred to use an aspheric focusing element 534 to provide a standard focal spot 856 on the MMA 100 similar to that shown in FIG. 11.

For the preferred embodiments herein disclosed, it is preferred to employ a single-element, aspheric lens, rather than multiple optical elements. This can provide a tighter focal spot 856 on the MMA 100, rather than the more defocused spot 857, as shown in FIG. 11. Focusing means comprising such an aspheric lens can provide the proper focusing quality with a minimal number of surfaces, and maximize output power and the tuning range of the laser.

For the preferred embodiments herein disclosed, it is preferred to employ a single-element, aspheric lens, rather than multiple optical elements. This can provide a tighter focal spot 856 on the MMA 100, rather than the more defocused spot 857, similar to that shown in FIG. 11. Such an aspheric lens that can provide the same focusing quality with the minimal number of surfaces as the focusing means to provide proper focusing quality, and maximize output power and the tuning range of the laser.

For the preferred embodiments disclosed herein, the focal length of the lens has to satisfy requirements that define a tradeoff between compact size of the device and spectral resolution of the laser tuning. In particular, as the focal length of the lens is decreased, the possible package size becomes smaller. But, at the same time, for a given MMA pitch, the spectral distance between wavelengths defined by adjacent micromirrors increases. If the desired optical frequency step, corresponding to the MMA pitch is defined (e.g., to match the ITU grid, see the later discussion), the focal length of the lens has to be a certain value, which can be found as described below. In the following, the focal length is calculated and two dimensions of the optical layout are defined: the distance between the focusing element 534 (e.g., lens) and the MMA 100, as well as that between the focusing element 534 and the dispersive element 530 (e.g., grating).

A well-known equation describes diffraction on the grating:

$$\sin\alpha + \sin\beta = m\frac{\lambda}{d}, \qquad (2)$$

where α is the angle of incidence on the grating, β is the angle of diffraction from the grating, λ is the wavelength, and d is the grating period/pitch. The typical choice of the diffraction grating period is such that for the working spectral range the first order of diffraction is the highest one present (m=1), though others can be chosen if desired. Two close wavelengths $\lambda_2 \cong \lambda_1$ differing from each other by $\Delta\lambda = \lambda_2 - \lambda_1$, will cause the difference in diffraction angle to be:

$$\Delta\beta = \frac{\Delta\lambda}{d \cdot \cos\beta}. \tag{3}$$

Using optical frequency $v=c/\lambda$, where c is the light velocity, and, because $\lambda_2 \cong \lambda_1$, $|\Delta\lambda| \cong \lambda^2 \Delta v/c$, this is re-expressed as:

$$\Delta\beta = \frac{\lambda^2 \cdot \Delta v}{c \cdot d \cdot \cos\beta} \tag{4}$$

If the focal length $f$ of the lens (optical focusing means) is chosen so that the distance between focal spots of the two wavelengths equals the MMA period/pitch $\alpha$, then the following is true:

$$f = \frac{a}{\Delta\beta} = \frac{a \cdot c \cdot d \cdot \cos\beta}{\lambda^2 \cdot \Delta v}. \tag{5}$$

For example, if it is desired to have $\Delta v=100$ GHz to match the ITU grid, if the diffraction grating has a grating period of d=1.1 µm from center-to-center from one ruling to the next, if the MMA has a center-to-center pitch of $\alpha=17$ µm from one micromirror to the next, if the central wavelength of the desired light is $\lambda=1.55$ µm, if one uses the first order m=1 of the diffraction grating, and if the $\alpha$ is the angle of incidence on the grating is $\alpha=80°$, then β may be deduced from eq. (2), and, after substitution into eq. (5), this yields a required focal length of $f=21.1$ mm for the lens.

Once this focal length is established, the MMA needs to be substantially at a distance defined substantially as this same focal length $f$ from the focusing element 534, for proper focusing.

Another distance of interest is that between the focusing element 534 and the dispersive element 530 (e.g., grating). In order for the cones of the focused light before and after reflection from the micromirrors to coincide, it is understood that this distance also needs to be equal to the focal length of the lens f. In this case, the axes of the cones will be oriented perpendicular to the micromirror surfaces and parallel to the optical axis of the lens. From the optical design point of view, the grating plane can be considered as the aperture stop of the telecentric optical system, which provides for axes of the cones of focused light to be parallel to the optical axis.

Again, a practical choice of the focal length of the focusing element 534 is such that adjacent micromirrors of the MMA correspond to adjacent optical frequencies of a predefined grid (e.g., ITU grid). Thus, it is preferred that: the focal length of the lens be chosen based on the MMA pitch, wavelength, grating period and angle of incidence according to the above formulae (2) through (5); the distance between the lens and the MMA be chosen equal to the same focal length; and the distance between the lens and the diffraction grating be chosen equal to the same focal length.

In the embodiment of FIGS. 7 and 8, where each separated wavelength is selected and reflected by a single MMA element, this tunable diode laser must be operated in a pulsed mode, because, as noted earlier, the MMA elements must be periodically cycled back and forth between +θ and −θ states in order to prevent the negative effects of memory and fatigue on the individual micromirror element hinges and thus deterioration and malfunction of the MMA over time. The pulse frequency and duration is controlled by the user via the control module 540. For non-pulsed, continuous wave (CW) operation, regional groups of micromirror array elements must be employed as will now be discussed.

As noted above, it is frequently desired to use various optical elements to suppress the ellipticity of a diode laser. However, by taking an opposite approach, and accentuating rather than suppressing the elliptical ratio, the basic configuration of FIGS. 7 and 8 can be expanded, particularly for telecommunications applications, by providing a way to operate in CW (continuous wave) mode while maintaining substantially constant output power. Such CW operation is possible by using an MMA with the 2-dimensional array format of the typical MMA shown in FIG. 3, while exploiting this naturally occurring ellipticity, and/or introducing further ellipticity by employing specially-designed optics, e.g., a specially-designed focusing element 534, in the overall configuration.

Figure 12:
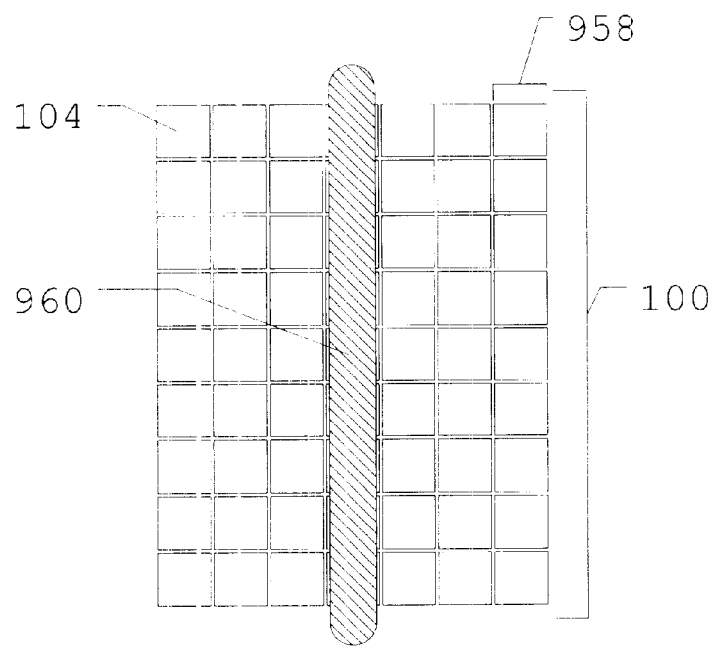
FIG. 12 is a top view of the MMA showing an enhanced, elongated focal spot allowing for CW operation of the tunable diode laser.
Figure 13:
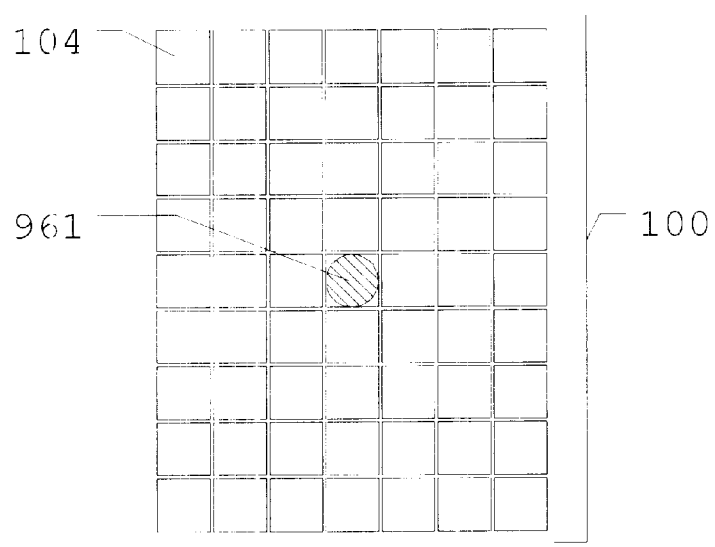
FIG. 13 is a top view of the MMA showing an improved focal spot as a result of using an aspheric lens focusing element.

As illustrated in FIG. 12, in an alternative embodiment of the invention enabling CW operation, focusing element 534 is designed differently so as to correct the astigmatism while forming or further accentuating an elliptical focal spot, such that a single wavelength of the diffracted light is focused on a column of micromirror elements 958 as opposed to a single micromirror element 104, 110. The resultant elliptical (or more generally, elongated) focal spot 960 is shown on the 2-dimensional MMA array 100 in FIG. 12.

This enhanced ellipticity can play a positive role for facilitating the CW operation of the laser by providing extended focal spots, covering a column of a plurality of micromirrors 104, 110 in the direction normal to the dispersion plane of the grating. If, instead of a single micromirror, such a column 960 of micromirrors is used for reflecting the selected wavelength, as shown in FIG. 12, CW operation can be achieved by setting all micromirrors of column 960 to their "off" state, one by one, in a cyclic manner, thus relieving the stress in the hinges and preventing memory in the hinges and stiction effects. Because of the large number of the micromirrors in any given column, the power loss from one micromirror set to its 'off' state is negligible.

This cycling of the individual MMA elements 104, 110 is preferably preprogrammed into control module 540 to occur in a continuous cycle for each chosen wavelength. The constant power output is a function of the number of individual mirror elements 104, 110 in the array column 958 that a single wavelength is focused on. The more mirror elements 104, 110 in a column 958, the smaller the percentage of total laser power that is controlled by a single micromirror element 104, 110, and the higher is the CW output power. Also, considering that there is some heterogeneity of the power distribution over the elliptical spot 960, using a larger number of micromirrors for each focal spot (in this case, elongated focal spot) provides more constant total output power when a single micromirror 104, 110 is switched to the alternative state. Thus, if N is the total number of micromirrors for a single wavelength, i.e., upon which an elongated, single-wavelength focal spot impinges, the micromirrors in the "on" state are cycled such that N−1 are on and the remaining 1 is off.

It is understood that the "off" state mirrors also should be cycled as well in order to prevent the same negative effects of memory in the hinges and stiction. The cycling of the "off" state micromirrors is opposite that of the "on" state mirrors, such that N−1 are off and the remaining 1 is on. Of course, this will reflect a small amount of energy of the undesired wavelengths back toward the active media, but, if N is large enough, the losses for the undesired wavelengths will be higher than the gain of the active media, and these undesired wavelengths will thus be below the laser threshold and be suppressed from the laser output 652.

If N is relatively small such that having 1 "off" state mirror retroreflecting retroreflects above threshold, then in a much less preferred embodiment, a loss filter (not shown) can be used to partially block all wavelengths of light returning to the active media 526, such that the weaker wavelengths (those reflected by only 1 micromirror) are eliminated while the stronger wavelengths (those reflected by N−1 micromirrors) are only slightly reduced in strength. Such a loss filter can filter all wavelengths approximately equivalently; alternatively, because the most power is generated toward the center of the active media spectrum, a filter with higher losses in the center of the spectrum and lower losses toward the ends of the spectrum would be preferred.

One of the performance characteristics of a tunable laser is power uniformity over the tuning range. In fiber optic telecommunications, the ability to level or otherwise adjust the power distribution of the laser source over the tuning range is very valuable. In some system architectures, such ability could eliminate the need for such components as gain-flattening filters and thus reduce the parts count and simplify the system design.

It is also possible in this CW mode of operation to control the power output at each desired wavelength. In applications such as WDM (Wavelength Division Multiplexing) and DWDM (Dense Wavelength Division Multiplexing) precise control of the output power at a given wavelength is a desirable feature. Employing the devices and method described above, precise control of the output power at a given wavelength could be maintained by always having a certain number of micromirror elements 104, 110 in the "on" state, and this number can be varied, for example, to account for heterogeneities in the focal ellipse or in the gain distribution of the active media.

Alternatively, while near-constant power is often a desired goal, there may be applications where certain variations in power are desired. Using an MMA column rather than a single MMA element for each wavelength provides the ability to vary the power, or keep it nearly constant, depending on the requirements of the particular application for which this system and its associated methods are being employed.

Thus, straightforward, one-at-a-time-per column, serial cycling is one cycling method that can be controlled by control module 540, though it will be apparent that other algorithms, possibly cycling one or more selected mirrors in a given column at any one time, might also be employed which account for such parameters as the number of mirrors in a column, the power and other characteristics of the wavelength being reflected by a given column, the heterogeneity of the focal spot and/or the active media 526, the desired power outputs, etc., with the goal of providing whatever power output characteristics (i.e., controlling the power) are desired for the given application.

Note, although this approach using an elliptical focal spot and a two-dimensional MMA array serves to overcome the memory and fatigue problems earlier outlined with respect to current MMA technology, that this approach is beneficial even if these MMA technology problems are overcome and subsequent MMA generations do not need this constant cycling. This is because the use of a 2-dimesional MMA in connection with an elliptical focal spot that, for each light frequency, impinges upon a plurality of micromirrors, allows precise control of the power at each wavelength, which can of course facilitate continuous wave operation, but more generally, can facilitate controlled power emissions, by wavelengths, in whatever manner is desired.

The function of properly focusing the light on the MMA by an aspheric lens and that of producing an elliptical spot on the same MMA can be combined in one optical device with a reduced number of elements, ultimately, in a single element. Thus, it is preferred to combine optical focusing means for focusing the separate component wavelengths of the wavelength-separated light into focused light and focal spot elongation means for elongating each of the separate component wavelengths of the wavelength-separated light, into a single optical element that will produce a well-focused elliptical spot on a row of micromirrors of the MMA.

In yet another preferred embodiment, one can improve upon the use of a wavelength filtering means such as a Fabry-Perot etalon as a means to tune the output frequency of a diode laser. As discussed in the Background of the Invention, a Fabry-Perot etalon is used in the art to stabilize or lock onto a single frequency in the output of a laser, whether a dye, diode, or other type of laser. By configuring a laser with a Fabry-Perot etalon to utilize an MMA for wavelength tuning, one can achieve an improved tunable laser capable of precisely selecting multiple frequencies simultaneously, preferably frequencies that coincide with the frequency standards of the ITU grid for 100 GHz or 50 GHz channel spacing, or other transmission standards that may be used now or in the future.

More generally, it possible to substantially match frequencies of the laser light output to a predetermined set of optical frequencies for any application where such frequency matching is useful, and for telecommunications applications, this predetermined set of optical frequencies is, of course, a telecommunications standard such as the ITU grid standards.

Figure 14:
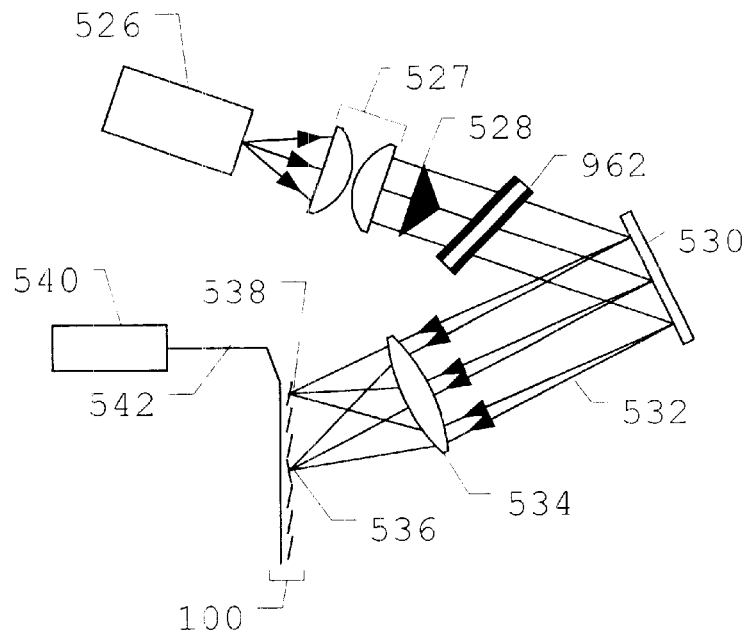
FIG. 14 is an optical schematic of a tunable diode laser/Fabry-Perot etalon combination placed in further combination with an MMA, for telecommunications and similar applications, showing the incident light path.
Figure 15:
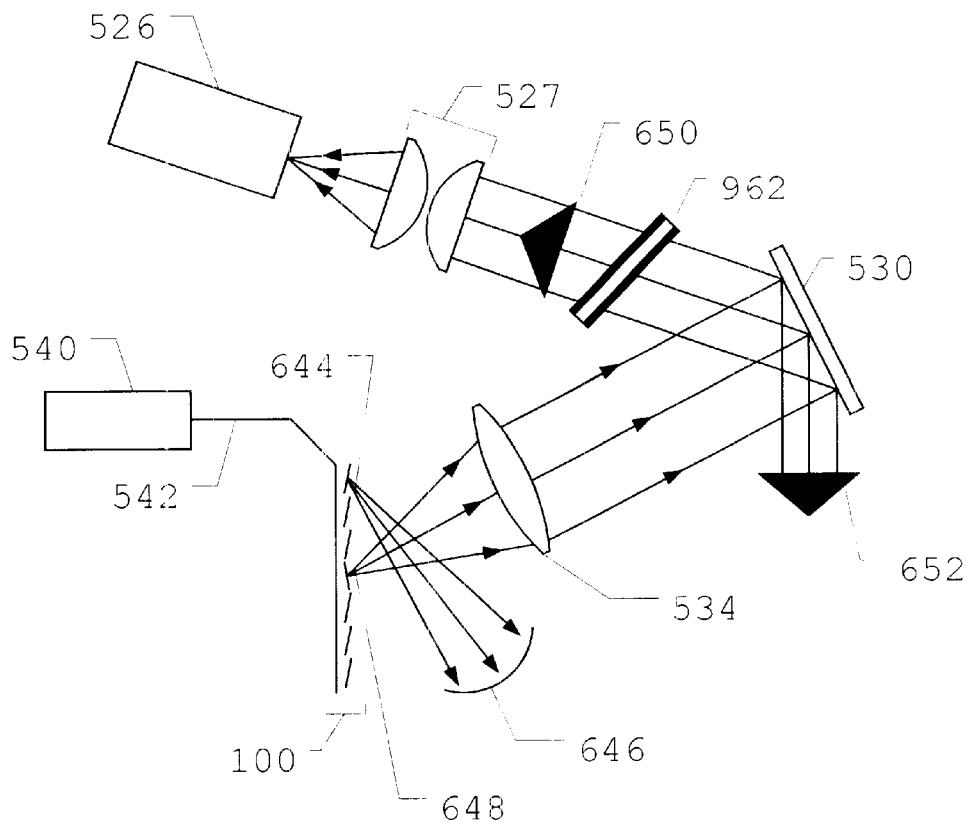
FIG. 15 is an optical schematic of the FIG. 14 combinations showing the reflective light path.

FIGS. 14 and 15 show the optical schematic of this alternative embodiment in which both a wavelength filtering means 962 such as a Fabry-Perot etalon and a MMA 100 have been included in the optical path in order to provide multiple simultaneous frequency selection along the ITU standards grid. FIG. 14 shows the transmitted path from active media 526 to the MMA 100, and FIG. 15 shows the reflected paths from the MMA 100 back to active media 526. As shown in these figures, the Fabry-Perot etalon is inserted, in the conventional manner, at a slight angle to the optical axis in the collimated beam of the laser diode 528. As in the preferred embodiment, this beam 528 is then diffracted by the diffraction grating 530 and focused onto the MMA 100.

The combination of an MMA 100 with the active media 526 and wavelength filtering means 962 combination provides a way to achieve digital, single-wavelength or multi-wavelength selectivity to the tunable diode laser system over FP etalon use in the prior art. As such, the path of light reflected from the MMA 100 and back into the cavity and active media 526 for lasing at the specific wavelength or wavelengths chosen, provides vastly improved capabilities over the prior art in the ability to digitally select multiple wavelengths specifically at, for example, the ITU intervals.

The combination of MMA 100 with the active media 526 and wavelength filtering means 962 combination provides the capability for digital optical frequency matching to the predetermined ITU grid, specifically for the current 100 GHz transmission and the future 50 GHz transmission, and for any other telecommunications standards that may evolve in time. Preferably, the Fabry-Perot etalon is a single-component Fabry-Perot interferometer that is customized to fit output requirements of the laser system. Coherent, collimated light transmitted through the etalon will produce a transmission spectrum consisting of the resonant frequencies of the etalon. The resonant frequencies of the etalon are dependent upon the thickness of the etalon and the incident angle of light and the frequency difference between adjacent orders (modes) of the etalon is simply:

$$\Delta v = \frac{c}{2nL\cos\theta} \quad (6)$$

Wherein:
ν=resonant frequency of the etalon
c=speed of light
n=index of refraction of the etalon glass
L=thickness of the etalon
θ=angle of incidence of light on etalon The wavelength filtering means 962 comprising an FP etalon used in the system of FIGS. 14 and 15 is thus designed to have an optical length nL (optical length) of approximately nL=1.5 mm for the Δv=100 GHz ITU transmission grid and nL=3 mm for the Δv=50 GHz ITU transmission grid, assuming a small angle θ, such that cos θ≈1.

Figure 1:
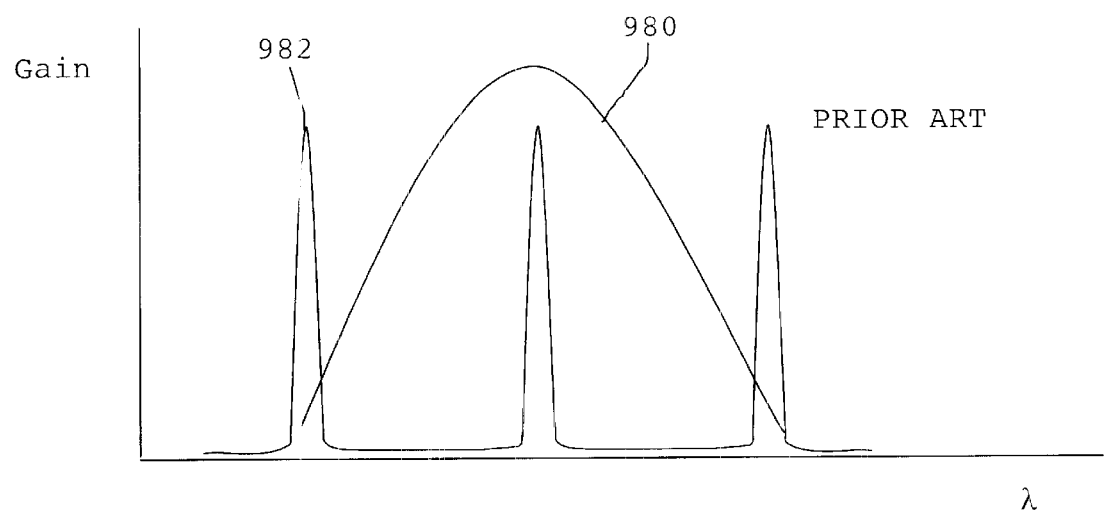
FIG. 1 is a prior art spectral gain curve of a dye laser overlaid with the etalon modes.
Figure 2:
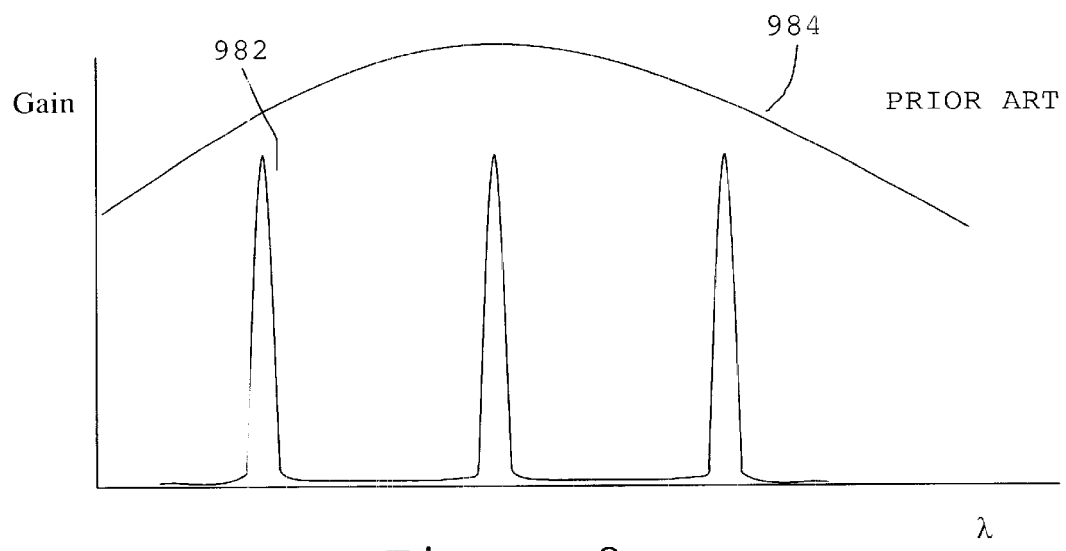
FIG. 2 is a prior art spectral gain curve of a diode laser overlaid with the etalon modes.
Figure 16:
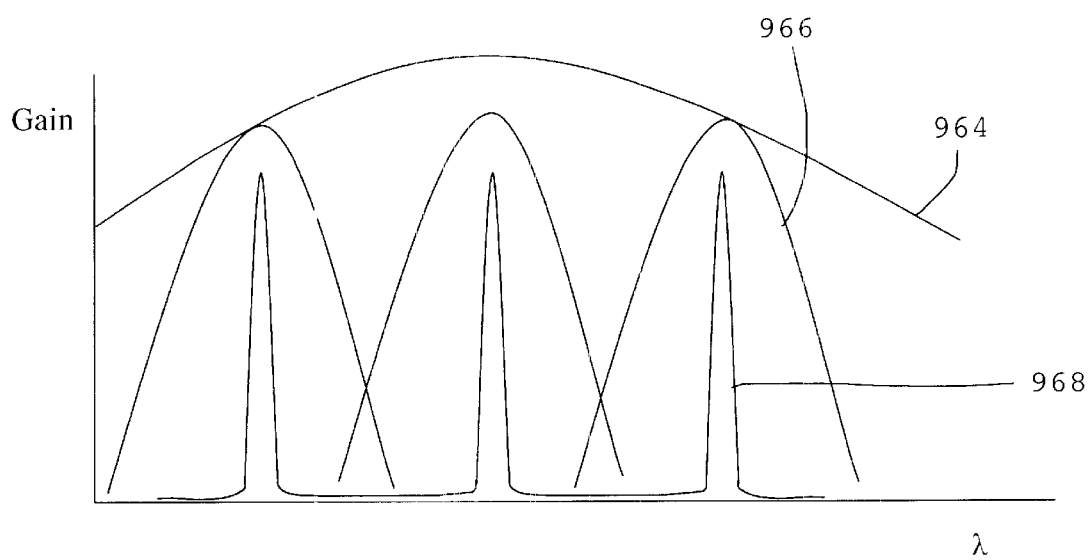
FIG. 16 is a spectral diagram resulting from the combinations of FIGS. 14 and 15.

Therefore, only these specified frequencies will be passed through the etalon to diffraction grating 530 and focused onto the MMA 100. The spectral diagram in FIG. 16 further illustrates the output capability of the embodiment of FIGS. 14 and 15. As shown in FIG. 16, the spectral gain of the typical laser diode shown by diode gain curve 964 is very broad, and alone is not capable of producing narrow single frequency output that could match the ITU transmission requirements. The invention embodiments without the FP etalon or similar wavelength filtering means 962 narrow the spectral output to individual wavelength regions that can be digitally switched, represented by tunable diode laser spectral output curves 966. Further precision in spectral selectivity, specifically matched to the ITU grid, is achieved with the wavelength filtering means 962. The unique combination of all of these elements allows for extremely precise digital tuning producing output represented by the tunable diode laser with etalon curves 968. Although this is the same etalon curve as shown in the prior art in FIG. 2, what is important is that each peak of this curve can now be digitally selected by employing an MMA in the manner that has been disclosed throughout. This unique combination provides a means of achieving digital tuning and multiple wavelength selection along the ITU grid not previously available with just a FP etalon and laser diode. The unique multi-wavelength tuning ability along the ITU grid is only available with the unique integration in the embodiment of FIGS. 14 and 15.

A wavelength filtering means 962 alternatively may comprise a tunable Fabry-Perot interferometer instead of the above-described etalon. The interferometer can be tuned by varying its optical length based on piezoelectric effect, electro-optic effect, current injection, or by any other means. All the above functionality discussed with regards to the etalon remains available with this equivalent substitution. In addition, fine-tuning of the output wavelength becomes possible by tuning the interferometer. More generally, any wavelength filtering means further comprising wavelength tuning means for tuning the output wavelength thereof is useful when continuous or quasi-continuous tuning is desired, and can be employed within the scope of this disclosure and its associated claims.

While FIGS. 14 and 15 illustrate a transmission-type wavelength filtering means, which is preferred, it is also understood that wavelength filtering means may comprise a reflection-type wavelength filtering means. What is necessary in all cases is that wavelength filtering means substantially allow wavelengths which are separated from one another by a specified optical frequency difference to emerge therefrom—whether by transmission or reflection—and substantially bar all other wavelengths from emerging therefrom.

While only certain preferred features of the invention have been illustrated and described, many modifications, changes and substitutions will occur to those skilled in the art. It is, therefore, to be understood that this disclosure and its associated claims are intended to cover all such modifications and changes as fall within the true spirit of the invention.

I claim:

1. A tunable laser system, comprising:
   wavelength filtering means for substantially allowing wavelengths of incoming light emitted from an active media which are separated from one another by a specified optical frequency difference to emerge therefrom as filtered light, and for substantially barring all other said wavelengths of said incoming light from emerging therefrom;
   wavelength separation means for separating said filtered light emerging from said wavelength filtering means, into wavelength-separated light comprising a plurality of separate component wavelengths of said filtered light;
   optical focusing means for focusing said separate component wavelengths of said wavelength-separated light into a plurality of single-wavelength focal spots, wherein each one of said single-wavelength focal spots is focused, but is displaced from, all others of said single-wavelength focal spots, within a common focal plane of said optical focusing means; and
   locally-controllable reflectivity array means comprising a plurality of individually-controllable localized reflective elements residing substantially within said common focal plane of said optical focusing means, each of said localized reflective elements corresponding to and reflecting one of said plurality of said single-wavelength focal spots based upon determined by a setting of said localized reflective element.

2. The system of claim 1, further comprising control module means for:
   determining which of said single-wavelength focal spots is to be selected for retro-reflection back toward said active media;
   causing each localized reflective element for which the corresponding wavelength is selected for retro-reflection to be set such that said corresponding selected wavelength is retro-reflected back toward said active media, as a retro-reflecting reflective element; and
   causing each localized reflective element for which the corresponding wavelength is not selected for retro-reflection to be set such that said corresponding not-selected wavelength is not retro-reflected back toward said active media, as a non-retro-reflecting reflective element.

3. The system of claim 2, used for simultaneously selecting a plurality of wavelengths for lasing; further comprising control module means for:

determining a plurality of said single-wavelength focal spots to be selected for simultaneous retro-reflection back toward said active media;

causing the localized reflective elements corresponding to said wavelengths so-selected for simultaneous retro-reflection back toward said active media to be set such that said corresponding wavelength is retro-reflected back toward said active media; and causing the remaining localized reflective elements corresponding to said wavelengths not so-selected for simultaneous retro-reflection back toward said active media to be set such that said corresponding wavelength is not retro-reflected back toward said active media.

4. The system of claim 2, used for sequentially selecting a plurality of sets of wavelengths for lasing; further comprising control module means for:

determining a plurality of sets of at least zero of said single-wavelength focal spots to be selected for sequential retro-reflection back toward said active media, as sequential selected wavelength sets;

at a first given moment, and again at a different, second given moment, causing the localized reflective elements corresponding to said wavelengths so-selected at the given moment for retro-reflection back toward said active media to be set such that said corresponding wavelengths are retro-reflected back toward said active media; and at said first given moment, and again said second given moment, causing the remaining localized reflective elements corresponding to said wavelengths not so-selected at the given moment for retro-reflection back toward said active media to be set such that said corresponding wavelengths are not retro-reflected back toward said active media.

5. The system of claim 2:

said locally-controllable reflectivity array means comprising a micromirror array;

said plurality of individually-controllable localized reflective elements comprising a plurality of individually-controllable micromirrors;

said control module means for causing each said retro-reflecting reflective element to be set comprising control module means for causing each micromirror for which the corresponding wavelength is selected for retro-reflection to be set in a first state such that said corresponding selected wavelength is retro-reflected back toward said active media; and said control module means for causing each said non-retro-reflecting reflective element to be set comprising control module means for causing each micromirror for which the corresponding wavelength is not selected for retro-reflection to be set in a second state such that said corresponding not-selected wavelength is not retro-reflected back toward said active media.

6. The system of claim 1, said wavelength filtering means comprising a Fabry-Perot etalon.

7. The system of claim 1, said wavelength filtering means comprising a tunable Fabry-Perot interferometer.

8. The system of claim 1, said wavelength filtering means comprising means for tuning said specified optical frequency difference and thus said filtered light emerging therefrom.

9. The system of claim 1, wherein said specified optical frequency difference of said wavelength filtering means is chosen so as to substantially match frequencies of a laser light output of said system to a predetermined set of optical frequencies.

10. The system of claim 9, wherein said specified set of optical frequencies is predetermined according to requirements of a telecommunications standard.

11. The system of claim 1, wherein:

a focal length f of said optical focusing means is chosen to be substantially equal to:

$$f = \frac{a}{\Delta\beta} = \frac{a \cdot c \cdot d \cdot \cos\beta}{\lambda^2 \cdot \Delta v},$$

where $\Delta v$ is a desired frequency difference for a laser light output of said system, d is a period of said wavelength separation means, $\alpha$ is a pitch of said locally-controllable reflectivity array means, $\lambda$ is a central wavelength of said incoming light, m is an order of said wavelength separation means used for separating said filtered light into said wavelength-separated light, and $\beta$ is deduced according to $$\sin\alpha + \sin\beta = m\frac{\lambda}{d},$$

where $\alpha$ is a angle of incidence of said filtered light onto said wavelength separation means;

a distance between said wavelength separation means and said optical focusing means is chosen to be substantially equal to said focal length f; and a distance between said optical focusing means and said locally-controllable reflectivity array means is chosen to be substantially equal to said focal length f.

12. The system of claim 1, said locally-controllable reflectivity array means further comprising a plurality of localized selective elements also residing substantially within said common focal plane of said optical focusing means, each said localized selective element corresponding with one of said localized reflective elements, and said localized selective elements separated from said corresponding localized reflective elements by no more than a maximum coplanarity separation distance h; wherein:

said maximum coplanarity separation distance h is determined by maintaining an ambiguity $\Delta v$ of an optical frequency v of said system to be less than a threshold percentage of an output frequency spacing of said system; wherein $$\Delta v = \frac{c}{\lambda^2} \cdot d\cos\beta \cdot \frac{Dh}{f^2}$$

and wherein:

$\lambda$ is a central wavelength of said incoming light, c is the speed of light, d is a period of said wavelength separation means, D is a diameter of said optical focusing means, f is focal length of said optical focusing means, and $\beta$ is a diffraction angle of said wavelength-separated light from said wavelength separation means; and wherein said threshold percentage is equal to approximately 15 percent.

13. The system of claim 1, said active media comprising a laser diode.

14. The system of claim 1, wherein at least one of said localized reflective elements is set to retro-reflect one of said single-wavelength focal spots back toward said active media, further comprising:

amplification means for amplifying said single-wavelength focal spots retro-reflected by said locally-controllable reflectivity array means, for lasing at the wavelengths of the retro-reflected light.

15. The system of claim 1, said wavelength separation means comprising diffraction means for diffracting said filtered light into said wavelength-separated light.

16. The system of claim 1, said optical focusing means comprising a focusing element selected from the focusing element group consisting of lenses and mirrors.

17. The system of claim 1:
said locally-controllable reflectivity array means comprising a micromirror array; and
said plurality of individually-controllable localized reflective elements comprising a plurality of individually-controllable micromirrors.

18. A tunable laser system, comprising:
wavelength separation means for separating incoming light emitted from an active media, into wavelength-separated light comprising a plurality of separate component wavelengths of said incoming light;
optical focusing means for focusing said separate component wavelengths of said wavelength-separated light into a plurality of single-wavelength focal spots, wherein each one of said single-wavelength focal spots is focused, but is displaced from, all others of said single-wavelength focal spots, within a common focal plane of said optical focusing means;
focal spot elongation means for elongating each of said separate component wavelengths of said wavelength-separated light into a plurality of elongated, single-wavelength focal spots; and
locally-controllable reflectivity array means comprising a plurality of sets of a plurality of individually-controllable localized reflective elements residing substantially within said common focal plane of said optical focusing means; each of said sets of said plurality of localized reflective elements corresponding to and reflecting one of said elongated, single-wavelength focal spots; each of said elongated, single-wavelength focal spots impinging on the plurality of localized reflective elements comprising its corresponding set of localized reflective elements; and each said localized reflective element within each of said sets reflecting a portion of its associated elongated, single-wavelength focal spots based upon determined by a setting of said localized reflective element.

19. The system of claim 18, further comprising control module means for:
determining which of said elongated, single-wavelength focal spots is to be selected for retro-reflection back toward said active media;
causing at least one localized reflective element within each set of localized reflective elements for which the corresponding wavelength is selected for retro-reflection to be set such that its portion of its corresponding selected wavelength is retro-reflected back toward said active media, as a retro-reflecting reflective element set;
causing at least one localized reflective element within each set of localized reflective elements for which the corresponding wavelength is not selected for retro-reflection to be set such that its portion of its corresponding not-selected wavelength is not retro-reflected back toward said active media, as non-retro-reflecting reflective element sets; and within any retro-reflecting reflective element set, determining which of said localized reflective elements are caused to be set to retro-reflect based upon at least one power output characteristic of a laser light output of said system.

20. The system of claim 19, used for simultaneously selecting a plurality of wavelengths for lasing; further comprising control module means for:
determining a plurality of said elongated, single-wavelength focal spots to be selected for simultaneous retro-reflection back toward said active media, using a plurality of said reflective element sets corresponding with said focal spots so-selected;
causing at least one localized reflective element within each reflective element set selected for retro-reflection to be set such that its portion of its corresponding single-wavelength focal spot is retro-reflected back toward said active media; and
causing at least one localized reflective element within each reflective element set not selected for retro-reflection to be set such that its portion of its corresponding single-wavelength focal spot is not retro-reflected back toward said active media.

21. The system of claim 19, used for sequentially selecting a plurality of sets of wavelengths for lasing; further comprising control module means for:
determining a plurality of sets of at least zero of said elongated, single-wavelength focal spots to be selected for sequential retro-reflection back toward said active media, as sequential selected wavelength sets;
at a first given moment, and again at a different, second given moment, causing at least one localized reflective element within each retro-reflecting reflective element set corresponding to the wavelengths so-selected at the given moment for retro-reflection to be set such that its portion of its corresponding single-wavelength focal spot is retro-reflected back toward said active media; and
at said first given moment, and again said second given moment, causing at least one reflective element within each non-retro-reflecting reflective element set corresponding to the wavelengths not so-selected at the given moment for retro-reflection back toward said active media to be set such that its portion of its corresponding single-wavelength focal spot is not retro-reflected back toward said active media.

22. The system of claim 19, said control module further comprising means for causing at least one first localized reflective element within each said retro-reflecting reflective element set to be set such that it does not retro-reflect its said corresponding wavelength back toward said active media at a first given time, and for causing at least one second localized reflective element different from said first localized reflective element within each said retro-reflecting reflective element set to be set such that it does not retro-reflect its said corresponding wavelength back toward said active media at a second given time different from said first given time, thereby exercising said first and second localized reflective elements to avoid stiction that would otherwise result from continuously maintaining said first and second localized reflective elements in a retro-reflecting state.

23. The system of claim 19, said control module further comprising means for causing at least one first localized reflective element within each said non-retro-reflecting reflective element set to be set such that it does retro-reflect its said corresponding wavelength back toward said active media at a first given time, and for causing at least one second localized reflective element different from said first localized reflective element within each said non-retro-reflecting reflective element set to be set such that it does retro-reflect its said corresponding wavelength back toward said active media at a second given time different from said first given time, thereby exercising said first and second localized reflective elements to avoid stiction that would otherwise result from continuously maintaining said first and second localized reflective elements in a non-retro-reflecting state.

24. The system of claim 19:
said locally-controllable reflectivity array means comprising a micromirror array;
said plurality of sets of a plurality of individually-controllable localized reflective elements comprising a plurality of sets of a plurality of individually-controllable micromirrors;
said control module means for causing at least one localized reflective element within said retro-reflecting reflective element set to be set comprising control module means for causing at least one of said micromirrors within each said set of micromirrors for which the corresponding wavelength is selected for retro-reflection to be set in a first state such that its portion of its corresponding single-wavelength focal spot is retro-reflected back toward said active media; and
aid control module means for causing at least one localized reflective element within said non-retro-reflecting reflective element sets to be set comprising control module means for causing at least one of said micromirrors for which the corresponding wavelength is not selected for retro-reflection to be set in a second state such that its portion of its corresponding single-wavelength focal spot is not retro-reflected back toward said active media.

25. The system of claim 18, wherein said at least one power output characteristic comprises maintaining substantially constant output power of said laser light output.

26. The system of claim 18, wherein said at least one power output characteristic comprises controlling a power output for at least one wavelength of said laser light output.

27. The system of claim 18, said optical focusing means and said focal spot elongation means comprising a single optical element.

28. The system of claim 27, said single optical element comprising an aspheric lens.

29. The system of claim 18, further comprising:
wavelength filtering means for substantially allowing wavelengths of said incoming light emitted from said active media which are separated from one another by a specified optical frequency difference to emerge therefrom as filtered light, and for substantially barring all other said wavelengths of said incoming light from emerging therefrom; wherein:
said incoming light separated by said wavelength separation means comprises said filtered light.

30. The system of claim 18, wherein:
a focal length f of said optical focusing means is chosen to be substantially equal to:

$$f = \frac{a}{\Delta\beta} = \frac{a \cdot c \cdot d \cdot \cos\beta}{\lambda^2 \cdot \Delta v},$$

where $\Delta v$ is a desired frequency difference for a laser light output of said system, d is a period of said wavelength separation means, $\alpha$ is a pitch of said locally-controllable reflectivity array means, $\lambda$ is a central wavelength of said incoming light, m is an order of said wavelength separation means used for separating said filtered light into said wavelength-separated light, and $\beta$ is deduced according to $$\sin\alpha + \sin\beta = m\frac{\lambda}{d},$$

where $\alpha$ is a angle of incidence of said filtered light onto said wavelength separation means;
a distance between said wavelength separation means and said optical focusing means is chosen to be substantially equal to said focal length f; and
a distance between said optical focusing means and said locally-controllable reflectivity array means is chosen to be substantially equal to said focal length f.

31. The system of claim 18, said locally-controllable reflectivity array means further comprising a plurality of localized selective elements also residing substantially within said common focal plane of said optical focusing means, each said localized selective element corresponding with one of said localized reflective elements, and said localized selective elements separated from said corresponding localized reflective elements by no more than a maximum coplanarity separation distance h; wherein:
said maximum coplanarity separation distance h is determined by maintaining an ambiguity $\Delta v$ of an optical frequency v of said system to be less than a threshold percentage of an output frequency spacing of said system; wherein $$\Delta v = \frac{c}{\lambda^2} \cdot d\cos\beta \cdot \frac{Dh}{f^2}$$

and wherein:
$\lambda$ is a central wavelength of said incoming light, c is the speed of light, d is a period of said wavelength separation means, D is a diameter of said optical focusing means, $f$ is focal length of said optical focusing means, and $\beta$ is a diffraction angle of said wavelength-separated light from said wavelength separation means; and wherein
said threshold percentage is equal to approximately 15 percent.

32. The system of claim 18, said active media comprising a laser diode.

33. The system of claim 18, wherein at least one of said localized reflective elements is set to retro-reflect a portion of one of said elongated, single-wavelength focal spots back toward said active media, further comprising:
amplification means for amplifying said single-wavelength focal spots retro-reflected by said locally-controllable reflectivity array means, for lasing at the wavelengths of the retro-reflected light.

34. The system of claim 18, said wavelength separation means comprising diffraction means for diffracting said incoming light into said wavelength-separated light.

35. The system of claim 18, said optical focusing means comprising a focusing element selected from the focusing element group consisting of lenses and mirrors.

36. The system of claim 18:
said locally-controllable reflectivity array means comprising a micromirror array; and said plurality of sets of a plurality of individually-controllable reflective elements comprising a plurality of sets of a plurality of individually-controllable micromirrors.

37. A tunable laser system, comprising:
wavelength separation means for separating incoming light emitted from an active media, into wavelength-separated light comprising a plurality of separate component wavelengths of said incoming light;
optical focusing means for focusing said separate component wavelengths of said wavelength-separated light into a plurality of single-wavelength focal spots, wherein each one of said single-wavelength focal spots is focused, but is displaced from, all others of said single-wavelength focal spots, within a common focal plane of said optical focusing means; and
a micromirror array comprising a plurality of individually-controllable micromirrors residing substantially within said common focal plane of said optical focusing means, each of said micromirrors corresponding to and reflecting one of said plurality of said single-wavelength focal spots of said separated light based upon determined by a setting of said micromirror.

38. The system of claim 37, further comprising control module means for:
determining which of said single-wavelength focal spots is to be selected for retro-reflection back toward said active media;
causing each micromirror for which the corresponding wavelength is selected for retro-reflection to be set in a first state such that said corresponding selected wavelength is retro-reflected back toward said active media, as a retro-reflecting micromirror; and
causing each micromirror for which the corresponding wavelength is not selected for retro-reflection to be set in a second such that said corresponding not-selected wavelength is not retro-reflected back toward said active media, as a non-retro-reflecting micromirror.

39. The system of claim 37, wherein said micromirror array is angled such that the micromirrors in said first state are substantially normal relative to a path of said single-wavelength focal spots.

40. The system of claim 39, wherein said micromirror array is angled at θ degrees relative to said micromirrors in said first state and thus at 90−θ degrees relative to said path of said single-wavelength focal spots, wherein said angle θ is non-zero; and
said optical focusing means is oriented to be substantially parallel to said micromirrors in said first state and is thus angled at substantially 90−θ degrees relative to said wavelength-separated light.

41. The system of claim 37, said optical focusing means comprising focus-improving means for substantially converting any elongation of a cross section of said single-wavelength focal spots into a substantially circular cross-section thereof.

42. The system of claim 41, said optical focusing means and said focus-improving means comprising a single optical element.

43. The system of claim 42, said single optical element comprising an aspheric lens.

44. The system of claim 37, wherein:
at least one of said micromirrors is set to retro-reflect one of said single-wavelength focal spots back toward said active media;
a laser light output of said system emerges from a zero order of said wavelength separation means; and
light retro-reflected by said micromirror array back toward said wavelength separation means emerges from a first order of said wavelength separation means back toward said active media.

45. The system of claim 37, wherein a laser light output thereof emerges from a rear facet of said active media.

46. The system of claim 37, wherein:
a focal length f of said optical focusing means is chosen to be substantially equal to:

$$f = \frac{a}{\Delta \beta} = \frac{a \cdot c \cdot d \cdot \cos\beta}{\lambda^2 \cdot \Delta v},$$

where $\Delta v$ is a desired frequency difference for a laser light output of said system, d is a period of said wavelength separation means, $\alpha$ is a pitch of said micromirror array, $\lambda$ is a central wavelength of said incoming light, m is an order of said wavelength separation means used for separating said filtered light into said wavelength-separated light, and $\beta$ is deduced according to $$\sin\alpha + \sin\beta = m\frac{\lambda}{d},$$

where $\alpha$ is a angle of incidence of said filtered light onto said wavelength separation means;
a distance between said wavelength separation means and said optical focusing means is chosen to be substantially equal to said focal length f; and
a distance between said optical focusing means and said micromirror array is chosen to be substantially equal to said focal length f.

47. A method for tuning a laser, comprising the steps of:
substantially allowing wavelengths of incoming light emitted from an active media which are separated from one another by a specified optical frequency difference to emerge as filtered light from wavelength filtering means, and substantially barring all other said wavelengths of said incoming light from emerging from said wavelength filtering means;
separating said filtered light emerging from said wavelength filtering means, into wavelength-separated light comprising a plurality of separate component wavelengths of said filtered light, using wavelength separation means;
focusing said separate component wavelengths of said wavelength-separated light into a plurality of single-wavelength focal spots, wherein each one of said single-wavelength focal spots is focused, but is displaced from, all others of said single-wavelength focal spots, within a common focal plane of optical focusing means, using said optical focusing means; and
reflecting each of said plurality of said single-wavelength focal spots based upon determined by a setting of an individually-controllable localized reflective element corresponding thereto, using locally-controllable reflectivity array means comprising a plurality of said localized reflective elements residing substantially within said common focal plane of said optical focusing means.

48. The method of claim 47, further comprising the steps of:
  determining which of said single-wavelength focal spots is to be selected for retro-reflection back toward said active media;
  causing each localized reflective element for which the corresponding wavelength is selected for retro-reflection to be set such that said corresponding selected wavelength is retro-reflected back toward said active media, as a retro-reflecting reflective element; and
  causing each localized reflective element for which the corresponding wavelength is not selected for retro-reflection to be set such that said corresponding not-selected wavelength is not retro-reflected back toward said active media, as a non-retro-reflecting reflective element.

49. The method of claim 48, further comprising the step of simultaneously selecting a plurality of wavelengths for lasing, in turn comprising the steps of:
  determining a plurality of said single-wavelength focal spots to be selected for simultaneous retro-reflection back toward said active media;
  causing the localized reflective elements corresponding to said wavelengths so-selected for simultaneous retro-reflection back toward said active media to be set such that said corresponding wavelength is retro-reflected back toward said active media; and
  causing the remaining localized reflective elements corresponding to said wavelengths not so-selected for simultaneous retro-reflection back toward said active media to be set such that said corresponding wavelength is not retro-reflected back toward said active media.

50. The method of claim 48, further comprising the step of sequentially selecting a plurality of wavelengths for lasing, in turn comprising the steps of:
  determining a plurality of sets of at least zero of said single-wavelength focal spots to be selected for sequential retro-reflection back toward said active media, as sequential selected wavelength sets;
  at a first given moment, and again at a different, second given moment, causing the localized reflective elements corresponding to said wavelengths so-selected at the given moment for retro-reflection back toward said active media to be set such that said corresponding wavelengths are retro-reflected back toward said active media;
  at said first given moment, and again said second given moment, causing the remaining localized reflective elements corresponding to said wavelengths not so-selected at the given moment for retro-reflection back toward said active media to be set such that said corresponding wavelengths are not retro-reflected back toward said active media.

51. The method of claim 48:
  said locally-controllable reflectivity array means comprising a micromirror array; and
  said plurality of individually-controllable localized reflective elements comprising a plurality of individually-controllable micromirrors:
  said step of causing each said retro-reflecting reflective element to be set comprising the step of causing each micromirror for which the corresponding wavelength is selected for retro-reflection to be set in a first state such that said corresponding selected wavelength is retro-reflected back toward said active media; and
  said step of causing each said non-retro-reflecting reflective element to be set comprising the step of causing each micromirror for which the corresponding wavelength is not selected for retro-reflection to be set in a second state such that said corresponding not-selected wavelength is not retro-reflected back toward said active media.

52. The method of claim 47, said wavelength filtering means comprising a Fabry-Perot etalon.

53. The method of claim 47, said wavelength filtering means comprising a tunable Fabry-Perot interferometer.

54. The method of claim 47, further comprising the step of tuning said specified optical frequency difference and thus said filtered light emerging from said wavelength filtering means.

55. The method of claim 47, further comprising the step of choosing said specified optical frequency difference of said wavelength filtering means so as to substantially match frequencies of a laser light output of said laser to a predetermined set of optical frequencies.

56. The method of claim 55, further comprising the step of predetermining said specified set of optical frequencies according to requirements of a telecommunications standard.

57. The method of claim 47, further comprising the steps of:
  choosing a focal length f of said optical focusing means to be substantially equal to:

$$f = \frac{a}{\Delta\beta} = \frac{a \cdot c \cdot d \cdot \cos\beta}{\lambda^2 \cdot \Delta v},$$

where $\Delta v$ is a desired frequency difference for a laser light output of said laser, d is a period of said wavelength separation means, $\alpha$ is a pitch of said locally-controllable reflectivity array means, $\lambda$ is a central wavelength of said incoming light, m is an order of said wavelength separation means used for separating said filtered light into said wavelength-separated light, and $\beta$ is deduced according to $$\sin\alpha + \sin\beta = m\frac{\lambda}{d},$$

where $\alpha$ is a angle of incidence of said filtered light onto said wavelength separation means;
  choosing a distance between said wavelength separation means and said optical focusing means to be substantially equal to said focal length f; and
  choosing a distance between said optical focusing means and said locally-controllable reflectivity array means to be substantially equal to said focal length f.

58. The method of claim 47, said locally-controllable reflectivity array means further comprising a plurality of localized selective elements also residing substantially within said common focal plane of said optical focusing means, each said localized selective element corresponding with one of said localized reflective elements, and said localized selective elements separated from said corresponding localized reflective elements by no more than a maximum coplanarity separation distance h; further comprising the step of:
  determining said maximum coplanarity separation distance h by maintaining an ambiguity $\Delta v$ of an optical frequency ν of said laser to be less than a threshold percentage of an output frequency spacing of said laser; wherein $$\Delta\nu = \frac{c}{\lambda^2} \cdot d\cos\beta \cdot \frac{Dh}{f^2}$$

and wherein:

λ is a central wavelength of said incoming light, c is the speed of light, d is a period of said wavelength separation means, D is a diameter of said optical focusing means, ƒ is focal length of said optical focusing means, and β is a diffraction angle of said wavelength-separated light from said wavelength separation means; and wherein said threshold percentage is equal to approximately 15 percent.

59. The method of claim 47, said active media comprising a laser diode.

60. The method of claim 47, further comprising the steps of:

setting at least one of said localized reflective elements to retro-reflect one of said single-wavelength focal spots back toward said active media; and amplifying said single-wavelength focal spots retro-reflected by said locally-controllable reflectivity array means, for lasing at the wavelengths of the retro-reflected light.

61. The method of claim 47, said wavelength separation means comprising diffraction means for diffracting said filtered light into said wavelength-separated light.

62. The method of claim 47, said optical focusing means comprising a focusing element selected from the focusing element group consisting of lenses and mirrors.

63. The method of claim 47:

said locally-controllable reflectivity array means comprising a micromirror array; and said plurality of individually-controllable localized reflective elements comprising a plurality of individually-controllable micromirrors.

64. A method of tuning a laser, comprising:

separating incoming light emitted from an active media, into wavelength-separated light comprising a plurality of separate component wavelengths of said incoming light, using wavelength separation means;

focusing said separate component wavelengths of said wavelength-separated light into a plurality of single-wavelength focal spots, wherein each one of said single-wavelength focal spots is focused, but is displaced from, all others of said single-wavelength focal spots, within a common focal plane of optical focusing means, elongating each of said separate component wavelengths of said wavelength-separated light into a plurality of elongated, single-wavelength focal spots, using focal spot elongation means;

impinging each of said elongated, single-wavelength focal spots on one of a plurality of sets of a plurality of individually-controllable localized reflective elements corresponding thereto; and reflecting each of said elongated, single-wavelength focal spots from its corresponding set of localized reflective elements, each said localized reflective element within each of said sets reflecting a portion of its associated elongated, single-wavelength focal spot based upon determined by a setting of said localized reflective element, using locally-controllable reflectivity array means comprising said plurality of said sets of said plurality of localized reflective elements residing substantially within said common focal plane of said optical focusing means.

65. The method of claim 64, further comprising the steps of:

determining which of said elongated, single-wavelength focal spots is to be selected for retro-reflection back toward said active media;

causing at least one localized reflective element within each set of localized reflective elements for which the corresponding wavelength is selected for retro-reflection to be set such that its portion of its corresponding selected wavelength is retro-reflected back toward said active media, as a retro-reflecting reflective element set;

causing at least one localized reflective element within each set of localized reflective elements for which the corresponding wavelength is not selected for retro-reflection to be set such that its portion of its corresponding not-selected wavelength is not retro-reflected back toward said active media, as a non-retro-reflecting reflective element set; and within any retro-reflecting reflective element set, determining which and how many of said localized reflective elements are caused to be set to retro-reflect based upon at least one power output characteristic of a laser light output of said laser.

66. The method of claim 65, further comprising the step of simultaneously selecting a plurality of said wavelengths, in turn comprising the steps of:

determining a plurality of said elongated, single-wavelength focal spots to be selected for simultaneous retro-reflection back toward said active media, using a plurality of said reflective element sets corresponding with said focal spots so-selected;

causing at least one localized reflective element within each reflective element set selected for retro-reflection to be set such that its portion of its corresponding single-wavelength focal spot is retro-reflected back toward said active media; and causing at least one localized reflective element within each reflective element set not selected for retro-reflection to be set such that its portion of its corresponding single-wavelength focal spot is not retro-reflected back toward said active media.

67. The method of claim 65, further comprising the step of sequentially selecting a plurality of sets of said wavelengths, in turn comprising the steps of:

determining a plurality of sets of at least zero of said elongated, single-wavelength focal spots to be selected for sequential retro-reflection back toward said active media, as sequential selected wavelength sets;

at a first given moment, and again at a different, second given moment, causing at least one localized reflective element within each retro-reflecting reflective element set corresponding to the wavelengths so-selected at the given moment for retro-reflection to be set such that its portion of its corresponding single-wavelength focal spot is retro-reflected back toward said active media;

at said first given moment, and again said second given moment, causing at least one reflective element within each non-retro-reflecting reflective element set corresponding to the wavelengths not so-selected at the given moment for retro-reflection back toward said active media to be set such that its portion of its corresponding single-wavelength focal spot is not retro-reflected back toward said active media.

68. The method of claim 65, further comprising the step of:
exercising at least one first localized reflective element and at least one second localized reflective element different from said first localized reflective element within each said retro-reflecting reflective element set to avoid stiction that would otherwise result from continuously maintaining said first and second localized reflective elements in a retro-reflecting state, in turn comprising the steps of:
at a first given time, causing said at least one first localized reflective element to be set such that it does not retro-reflect its said corresponding wavelength back toward said active media; and
at a second given time different from said first given time, causing said at least one second localized reflective element to be set such that it does not retro-reflect its said corresponding wavelength back toward said active media.

69. The method of claim 65, further comprising the step of:
exercising at least one first localized reflective element and at least one second localized reflective element different from said first localized reflective element within each said non-retro-reflecting reflective element set to avoid stiction that would otherwise result from continuously maintaining said first and second localized reflective elements in a non-retro reflecting state, in turn comprising the steps of:
at a first given time, causing said at least one first localized reflective element to be set such that it does retro-reflect its said corresponding wavelength back toward said active media; and
at a second given time different from said first given time, causing said at least one second localized reflective element to be set such that it does retro-reflect its said corresponding wavelength back toward said active media.

70. The method of claim 65:
said locally-controllable reflectivity array means comprising a micromirror array;
said plurality of sets of a plurality of individually-controllable localized reflective elements comprising a plurality of sets of a plurality of individually-controllable micromirrors:
said step of causing at least one localized reflective element within said retro-reflecting reflective element set comprising the step of causing at least one of said micromirrors within each said set of micromirrors for which the corresponding wavelength is selected for retro-reflection to be set in a first state such that its portion of its corresponding single-wavelength focal spot is retro-reflected back toward said active media; and
said step of causing at least one localized reflective element within said non-retro-reflecting reflective element sets to be set comprising the step of causing at least one of said micromirrors for which the corresponding wavelength is not selected for retro-reflection to be set in a second state such that its portion of its corresponding single-wavelength focal spot is not retro-reflected back toward said active media.

71. The method of claim 64, said at least one power output characteristic comprising maintaining substantially constant output power of said laser light output.

72. The method of claim 64, said at least one power output characteristic comprising controlling a power output for at least one wavelength of said laser light output.

73. The method of claim 64, said optical focusing means and said focal spot elongation means comprising a single optical element.

74. The method of claim 73, said single optical element comprising an aspheric lens.

75. The method of claim 64, further comprising the steps of:
substantially allowing wavelengths of said incoming light emitted from said active media which are separated from one another by a specified optical frequency difference to emerge as filtered light from wavelength filtering means, and substantially barring all other said wavelengths of said incoming light from emerging from said wavelength filtering means; wherein:
said incoming light separated by said wavelength separation means comprises said filtered light.

76. The method of claim 64, further comprising the steps of:
choosing a focal length f of said optical focusing means to be substantially equal to:

$$f = \frac{a}{\Delta\beta} = \frac{a \cdot c \cdot d \cdot \cos\beta}{\lambda^2 \cdot \Delta v},$$

where $\Delta v$ is a desired frequency difference for a laser light output of said laser, d is a period of said wavelength separation means, $\alpha$ is a pitch of said locally-controllable reflectivity array means, $\lambda$ is a central wavelength of said incoming light, m is an order of said wavelength separation means used for separating said filtered light into said wavelength-separated light, and $\beta$ is deduced according to $$\sin\alpha + \sin\beta = m\frac{\lambda}{d},$$

where $\alpha$ is a angle of incidence of said filtered light onto said wavelength separation means;
choosing a distance between said wavelength separation means and said optical focusing means to be substantially equal to said focal length f; and
choosing a distance between said optical focusing means and said locally-controllable reflectivity array means to be substantially equal to said focal length f.

77. The method of claim 64, said locally-controllable reflectivity array means further comprising a plurality of localized selective elements also residing substantially within said common focal plane of said optical focusing means, each said localized selective element corresponding with one of said localized reflective elements, and said localized selective elements separated from said corresponding localized reflective elements by no more than a maximum coplanarity separation distance h; further comprising the step of:
determining said maximum coplanarity separation distance h by maintaining an ambiguity $\Delta v$ of an optical frequency v of said laser to be less than a threshold percentage of an output frequency spacing of said laser; wherein $$\Delta v = \frac{c}{\lambda^2} \cdot d\cos\beta \cdot \frac{Dh}{f^2}$$

and wherein:

λ is a central wavelength of said incoming light, c is the speed of light, d is a period of said wavelength separation means, D is a diameter of said optical focusing means, ƒ is focal length of said optical focusing means, and β is a diffraction angle of said wavelength-separated light from said wavelength separation means; and wherein said threshold percentage is equal to approximately 15 percent.

78. The method of claim 64, said active media comprising a laser diode.

79. The method of claim 64, further comprising the steps of:

setting at least one of said localized reflective elements to retro-reflect a portion of one of said elongated, single-wavelength focal spots back toward said active media; and amplifying said single-wavelength focal spots retro-reflected by said locally-controllable reflectivity array means, for lasing at the wavelengths of the retro-reflected light.

80. The method of claim 64, said wavelength separation means comprising diffraction means for diffracting said incoming light into said wavelength-separated light.

81. The method of claim 64, said optical focusing means comprising a focusing element selected from the focusing element group consisting of lenses and mirrors.

82. The method of claim 64:

said locally-controllable reflectivity array means comprising a micromirror array; and said plurality of sets of a plurality of individually-controllable localized reflective elements comprising a plurality of sets of a plurality of individually-controllable micromirrors.

83. A method for tuning a laser, comprising the steps of:

separating incoming light emitted from an active media, into wavelength-separated light comprising a plurality of separate component wavelengths of said incoming light, using wavelength separation means;

focusing said separate component wavelengths of said wavelength-separated light into a plurality of single-wavelength focal spots, wherein each one of said single-wavelength focal spots is focused, but is displaced from, all others of said single-wavelength focal spots, within a common focal plane of optical focusing means, and reflecting one of said plurality of said single-wavelength focal spots of said separated light based upon determined by a setting of said micromirror corresponding thereto, using a micromirror array comprising a plurality of individually-controllable micromirrors residing substantially within said common focal plane of said optical focusing means.

84. The method of claim 83, further comprising the steps of:

determining which of said single-wavelength focal spots is to be selected for retro-reflection back toward said active media;

causing each micromirror for which the corresponding wavelength is selected for retro-reflection to be set in a first state such that said corresponding selected wavelength is retro-reflected back toward said active media, as a retro-reflecting micromirror; and causing each micromirror for which the corresponding wavelength is not selected for retro-reflection to be set in a second state such that said corresponding wavelength not-selected is not retro-reflected back toward said active media, as a non-retro-reflecting micromirror.

85. The method of claim 83, further comprising the step of:

angling said micromirror array such that the micromirrors in said first state are substantially normal relative to a path of said single-wavelength focal spots.

86. The method of claim 85, further comprising the steps of: angling said micromirror array at θ degrees relative to said micromirrors in said first state and thus at 90−θ degrees relative to said path of said single-wavelength focal spots, wherein said angle θ is non-zero; and orienting said optical focusing means to be substantially parallel to said micromirrors in said first state and thus angled at substantially 90−θ degrees relative to said wavelength-separated light.

87. The method of claim 83, said optical focusing means comprising focus-improving means for substantially converting any elongation of a cross section of said single-wavelength focal spots into a substantially circular cross-section thereof.

88. The method of claim 87, said optical focusing means and said focus-improving means comprising a single optical element.

89. The method of claim 88, said single optical element comprising an aspheric lens.

90. The method of claim 83, further comprising the steps of:

setting at least one of said micromirrors to retro-reflect one of said single-wavelength focal spots back toward said active media;

emerging a laser light output of said laser from a zero order of said wavelength separation means; and emerging light retro-reflected by said micromirror array back toward said wavelength separation means from a non-zero order of said wavelength separation means back toward said active media.

91. The method of claim 83, further comprising the step of emerging a laser light output of said laser from a rear facet of said active media.

92. The method of claim 83, further comprising the steps of:

choosing a focal length f of said optical focusing means to be substantially equal to:

$$f = \frac{a}{\Delta\beta} = \frac{a \cdot c \cdot d \cdot \cos\beta}{\lambda^2 \cdot \Delta v},$$

where Δv is a desired frequency difference for a laser light output of said laser, d is a period of said wavelength separation means, α is a pitch of said micromir ror array, $\lambda$ is a central wavelength of said incoming light, m is an order of said wavelength separation means used for separating said filtered light into said wavelength-separated light, and $\beta$ is deduced according to $$\sin\alpha + \sin\beta = m\frac{\lambda}{d},$$

where $\alpha$ is a angle of incidence of said filtered light onto said wavelength separation means;

choosing a distance between said wavelength separation means and said optical focusing means to be substantially equal to said focal length f; and choosing a distance between said optical focusing means and said micromirror array to be substantially equal to said focal length f.

* * * * *

UNITED STATES PATENT AND TRADEMARK OFFICE
CERTIFICATE OF CORRECTION

PATENT NO. : 6,671,295 B2
DATED : December 30, 2003
INVENTOR(S) : Mikhail A. Gutin It is certified that error appears in the above-identified patent and that said Letters Patent is hereby corrected as shown below:

Column 18,
Line 45, delete "determined by" after "based upon".

Column 21,
Line 47, delete "determined by" after "based upon".

Column 25,
Line 23, delete "determined by" after "based upon".

Column 26,
Line 61, delete "determined by" after "based upon".

Column 30,
Line 1, delete "determined by" after "based upon".

Column 33,
Lines 57-58, delete "determined by" after "based upon".

Signed and Sealed this

Twenty-fourth Day of August, 2004

JON W. DUDAS
*Director of the United States Patent and Trademark Office*